United States Patent
Yu et al.

(10) Patent No.: US 11,488,908 B2
(45) Date of Patent: *Nov. 1, 2022

(54) SEMICONDUCTOR DEVICE AND METHOD

(71) Applicant: Taiwan Semiconductor Manufacturing Company, Ltd., Hsinchu (TW)

(72) Inventors: Chen-Hua Yu, Hsinchu (TW); Hui-Jung Tsai, Hsinchu (TW); Hung-Jui Kuo, Hsinchu (TW); Chung-Shi Liu, Hsinchu (TW); Han-Ping Pu, Taichung (TW); Ting-Chu Ko, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 292 days.

This patent is subject to a terminal disclaimer.

(21) Appl. No.: 16/587,690

(22) Filed: Sep. 30, 2019

(65) Prior Publication Data

US 2020/0027838 A1 Jan. 23, 2020

Related U.S. Application Data

(62) Division of application No. 16/028,874, filed on Jul. 6, 2018, now Pat. No. 10,629,540.
(Continued)

(51) Int. Cl.
*H01L 21/48* (2006.01)
*H01L 21/56* (2006.01)
(Continued)

(52) U.S. Cl.
CPC ...... *H01L 23/5389* (2013.01); *H01L 21/4853* (2013.01); *H01L 21/4857* (2013.01); *H01L 21/56* (2013.01); *H01L 21/565* (2013.01); *H01L 21/568* (2013.01); *H01L 21/6835* (2013.01); *H01L 23/3114* (2013.01); *H01L 23/3128* (2013.01); *H01L 23/5383* (2013.01); *H01L 23/5386* (2013.01); *H01L 24/19* (2013.01);
(Continued)

(58) Field of Classification Search
None
See application file for complete search history.

(56) References Cited

U.S. PATENT DOCUMENTS 8,361,842 B2 1/2013 Yu et al.
8,680,647 B2 3/2014 Yu et al.
(Continued)

FOREIGN PATENT DOCUMENTS

CN 107180795 A 9/2017
TW I490986 B 7/2015
(Continued)

*Primary Examiner* — Jay C Chang
(74) *Attorney, Agent, or Firm* — Slater Matsil, LLP

(57) ABSTRACT

In accordance with some embodiments a via is formed over a semiconductor device, wherein the semiconductor device is encapsulated within an encapsulant 129. A metallization layer and a second via are formed over and in electrical connection with the first via, and the metallization layer and the second via are formed using the same seed layer. Embodiments include fully landed vias, partially landed vias in contact with the seed layer, and partially landed vias not in contact with the seed layer.

20 Claims, 28 Drawing Sheets

Related U.S. Application Data

(60) Provisional application No. 62/564,134, filed on Sep. 27, 2017.

(51) Int. Cl.
  *H01L 21/683* (2006.01)
  *H01L 23/538* (2006.01)
  *H01L 23/31* (2006.01)
  *H01L 23/00* (2006.01)

(52) U.S. Cl.
  CPC .... *H01L 24/20* (2013.01); *H01L 2221/68345* (2013.01); *H01L 2224/18* (2013.01); *H01L 2224/214* (2013.01)

(56) References Cited

U.S. PATENT DOCUMENTS

| | | | |
|---|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,640,498 B1 | 5/2017 | Huang et al. |
| 9,831,148 B2 | 11/2017 | Yu et al. |
| 9,899,255 B2 | 2/2018 | Hourani et al. |
| 2011/0291288 A1 | 12/2011 | Wu et al. |
| 2012/0326296 A1* | 12/2012 | Choi ............ H01L 24/13 257/737 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0312508 A1 | 10/2014 | Boyanov et al. |
| 2016/0020172 A1* | 1/2016 | Su ............ H01L 23/5389 257/530 |

FOREIGN PATENT DOCUMENTS

| | | |
|---|---|---|
| TW | 201635469 A | 10/2016 |
| TW | 201715681 A | 5/2017 |

* cited by examiner

SEMICONDUCTOR DEVICE AND METHOD

PRIORITY CLAIM AND CROSS-REFERENCE

This application is a divisional to U.S. patent application Ser. No. 16/028,874, filed on Jul. 6, 2018, entitled "Semiconductor Device and Method," which claims priority to and the benefit of U.S. Provisional Application No. 62/564,134, filed on Sep. 27, 2017, entitled "Semiconductor Device and Method," which applications are hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
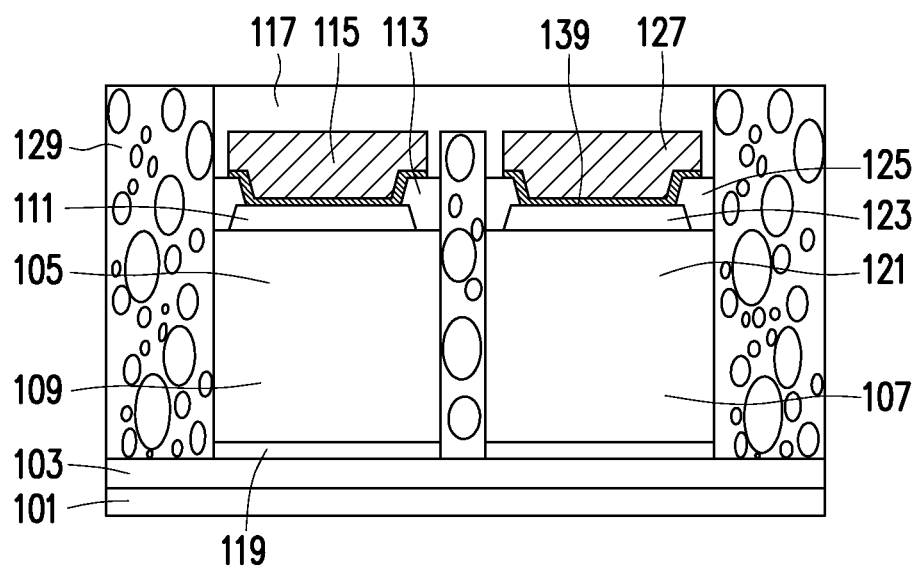
FIGS. 1A-6 illustrate fully landed vias on metallization layers, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to an ultra high density redistribution layer interconnect of an integrated fan out (InFO) package. However, embodiments are not intended to be limited to the embodiments described herein but, rather, could be used in a wide variety of applications.

With reference now to FIG. 1A, there is shown a first carrier substrate 101, a polymer layer 103, a first semiconductor device 105 and a second semiconductor device 107 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of the first semiconductor device 105 and the second semiconductor device 107.

The polymer layer 103 is placed over the first carrier substrate 101 and is utilized in order to provide protection to, e.g., the first semiconductor device 105 and the second semiconductor device 107 once the first semiconductor device 105 and the second semiconductor device 107 have been attached. In an embodiment the polymer layer 103 is a dielectric such as an epoxy-based thermal-release material, which loses its adhesive property when heated, such as a light-to-heat-conversion (LTHC) release coating. In other embodiments, the polymer layer 103 may be an ultra-violet (UV) glue, which loses its adhesive property when exposed to UV lights. The polymer layer 103 may be dispensed as a liquid and cured, may be a laminate film laminated onto the first carrier substrate 101, or the like.

In an embodiment the first semiconductor device 105 may be a first die and comprise a first substrate 109, first active devices, first die metallization layers, first contact pads 111, a first passivation layer 113, and first external connectors 115. The first substrate 109 may comprise silicon, doped or undoped, or an active layer of a semiconductor-on-insulator (SOI) substrate. The first substrate 109 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The first active devices comprise a wide variety of active devices and passive devices such as transistors, diodes, capacitors, resistors, inductors and the like that may be used to generate the desired structural and functional requirements of the design for the first semiconductor device 105. The first active devices may be formed using any suitable methods either within or else on the first substrate 109.

The first die metallization layers are formed over the first substrate 109 and the first active devices and are designed to connect the various active devices to form functional circuitry. In an embodiment the first die metallization layers are formed of alternating layers of dielectric and conductive material and may be formed through any suitable process (such as deposition, damascene, dual damascene, etc.). In an embodiment there may be layers of metallization separated from the first substrate 109 by at least one interlayer dielectric layer (ILD), but the precise number of first die metallization layers is dependent upon the design of the first semiconductor device 105.

The first contact pads 111 may be formed over and in electrical contact with the first die metallization layers. The first contact pads 111 may comprise aluminum, but other materials, such as copper, may alternatively be used. The first contact pads 111 may be formed using a deposition process, such as sputtering, to form a layer of material and portions of the layer of material may then be removed through a suitable process (such as photolithographic masking and etching) to form the first contact pads 111. However, any other suitable process may be utilized to form the first contact pads 111. The first contact pads 111 may be formed to have a thickness of greater than about between about 0.1 μm and about 10 μm, such as about 1.45 μm.

The first passivation layer 113 may be formed on the first substrate 109 over the first die metallization layers and the first contact pads 111. The first passivation layer 113 may be made of one or more suitable dielectric materials such as polybenzoxazole (PBO), although any suitable material, such as polyimide or a polyimide derivative, may alternatively be utilized. The first passivation layer 113 may be formed using, e.g., a spin-coating process to a thickness of between about 5 μm and about 25 μm, such as about 7 μm, although any suitable method and thickness may alternatively be used.

The first external connectors 115 may be formed to provide conductive regions for contact between the first contact pads 111 and, e.g., first vias 135. In an embodiment the first external connectors 115 may be conductive pillars and may be formed by initially forming a photoresist over the first passivation layer 113 to a thickness between about 5 μm to about 20 μm, such as about 10 μm. The photoresist may be patterned to expose portions of the first passivation layers 113 through which the conductive pillars will extend. Once patterned, the photoresist may then be used as a mask to remove the desired portions of the first passivation layer 113, thereby exposing those portions of the underlying first contact pads 111 to which the first external connectors 115 will make contact.

The first external connectors 115 may be formed within the openings of both the first passivation layer 113 and the photoresist. The first external connectors 115 may be formed from a conductive material such as copper, although other conductive materials such as nickel, gold, or metal alloy, combinations of these, or the like may also be used. Additionally, the first external connectors 115 may be formed using a process such as electroplating, by which an electric current is run through conductive portions of the first contact pads 111 to which the first external connectors 115 are desired to be formed, and the first contact pads 111 are immersed in a solution. The solution and the electric current deposit, e.g., copper, within the openings in order to fill and/or overfill the openings of the photoresist and the first passivation layer 113, thereby forming the first external connectors 115. Excess conductive material and photoresist outside of the openings of the first passivation layer 113 may then be removed using, for example, an ashing process, a chemical mechanical polish (CMP) process, combinations of these, or the like.

However, as one of ordinary skill in the art will recognize, the above described process to form the first external connectors 115 is merely one such description, and is not meant to limit the embodiments to this exact process. Rather, the described process is intended to be merely illustrative, as any suitable process for forming the first external connectors 115 (such as placing a seed layer 139 or an undermetallization layer before the rest of the first external connectors 115) may alternatively be utilized. All suitable processes are fully intended to be included within the scope of the present embodiments.

Optionally, a protection layer 117 may be formed over the first external connectors 115 after formation. In an embodiment the protection layer 117 may be formed to cover the exposed top and side surfaces of the first external connectors 115 during further processing, and may be made of, e.g., a low temperature cured polyimide (LTPI) or high temperature cured PBO (HTPBO). However, any suitable material may be utilized.

A die attach film (DAF) 119 may be placed on an opposite side of the first substrate 109 in order to assist in the attachment of the first semiconductor device 105 to the polymer layer 103. In an embodiment the die attach film 119 is any suitable adhesive, epoxy resin, a phenol resin, acrylic rubber, silica filler, or a combination thereof, and is applied using a lamination technique. However, any other suitable alternative material and method of formation may alternatively be utilized.

FIG. 1A additionally illustrates a placement of the first semiconductor device 105 onto the polymer layer 103 along with a placement of the second semiconductor device 107. In an embodiment the second semiconductor device 107 may comprise a second substrate 121, second active devices, second die metallization layers, second contact pads 123, a second passivation layer 125, and second external connectors 127. In an embodiment the second substrate 121, the second active devices, the second die metallization layers, the second contact pads 123, the second passivation layer 125, and the second external connectors 127 may be similar to the first substrate 109, the first active devices, the first die metallization layers, the first contact pads 111, the first passivation layer 113, and the first external connectors 115, although they may also be different.

In an embodiment the first semiconductor device 105 and the second semiconductor device 107 may be placed onto the polymer layer 103 using, e.g., a pick and place process. However, any other method of placing the first semiconductor device 105 and the second semiconductor device 107 may also be utilized.

FIG. 1A also illustrates an encapsulation of the first semiconductor device 105 and the second semiconductor device 107. The encapsulation may be performed in a molding device, which may comprise a top molding portion and a bottom molding portion separable from the top molding portion. When the top molding portion is lowered to be adjacent to the bottom molding portion, a molding cavity may be formed for the first carrier substrate 101, the first semiconductor device 105, and the second semiconductor device 107.

During the encapsulation process the top molding portion may be placed adjacent to the bottom molding portion, thereby enclosing the first carrier substrate 101, the first semiconductor device 105, and the second semiconductor device 107 within the molding cavity. Once enclosed, the top molding portion and the bottom molding portion may form an airtight seal in order to control the influx and outflux of gasses from the molding cavity. Once sealed, an encapsulant 129 may be placed within the molding cavity.

The encapsulant 129 may be an epoxy or a molding compound resin such as polyimide, polyphenylene sulfide (PPS), polyetheretherketone (PEEK), poly ether sulphone (PES), a heat resistant crystal resin, combinations of these, or the like. The encapsulant 129 may be placed within the molding cavity prior to the alignment of the top molding portion and the bottom molding portion, or else may be injected into the molding cavity through an injection port, using compression molding, transfer molding, or the like.

Once the encapsulant 129 is placed into the molding cavity such that the encapsulant 129 encapsulates the first carrier substrate 101, the first semiconductor device 105, and the second semiconductor device 107, the encapsulant 129 may be cured in order to harden the encapsulant 129 for optimum protection. While the exact curing process is dependent at least in part on the particular material chosen for the encapsulant 129, in an embodiment in which molding compound is chosen as the encapsulant 129, the curing could occur through a process such as heating the encapsulant 129 to between about 100° C. and about 200° C., such as about 125° C. for about 60 sec to about 3000 sec, such as about 600 sec. Additionally, initiators and/or catalysts may be included within the encapsulant 129 to better control the curing process.

However, as one having ordinary skill in the art will recognize, the curing process described above is merely an exemplary process and is not meant to limit the current embodiments. Other curing processes, such as irradiation or even allowing the encapsulant 129 to harden at ambient temperature, may alternatively be used. Any suitable curing process may be used, and all such processes are fully intended to be included within the scope of the embodiments discussed herein.

Figure 1B:
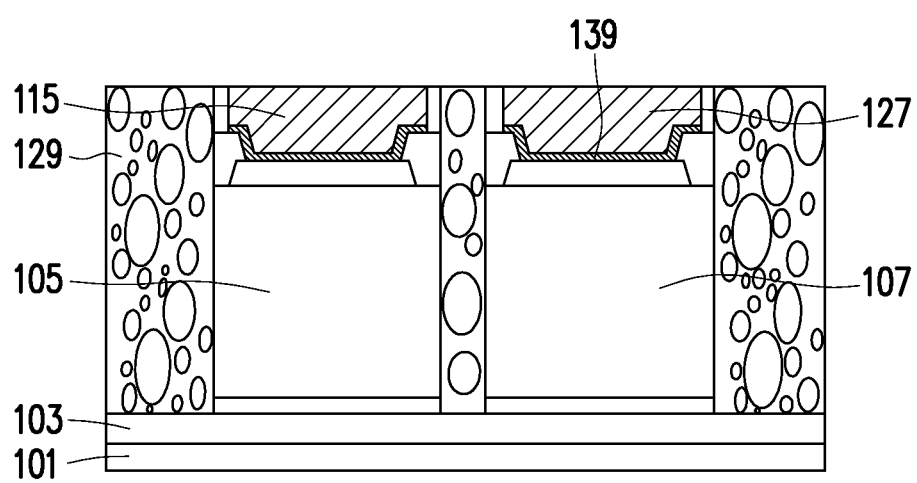

FIG. 1B illustrates a thinning of the encapsulant 129 in order to expose the first semiconductor device 105 and the second semiconductor device 107 for further processing. The thinning may be performed, e.g., using a mechanical grinding, chemical approaches, or chemical mechanical polishing (CMP) process whereby chemical etchants and abrasives are utilized to react and grind away the encapsulant 129, the first semiconductor device 105 and the second semiconductor device 107 so that the first external connectors 115 (on the first semiconductor device 105), and the second external connectors 127 (on the second semiconductor device 107) have been exposed. As such, the first semiconductor device 105 and the second semiconductor device 107 may have a planar surface that is also coplanar with the encapsulant 129.

In another embodiment, the grinding may be omitted. For example, if the first semiconductor device 105 and the second semiconductor device 107 are already exposed after encapsulation, the grinding may be omitted.

Furthermore, while the CMP process described above is presented as one illustrative embodiment, it is not intended to be limiting to the embodiments. Any other suitable removal process may be used to thin the encapsulant 129, the first semiconductor device 105, and the second semiconductor device 107. For example, a series of chemical etches may be utilized. This process and any other suitable process may be utilized to planarize the encapsulant 129, the first semiconductor device 105, and the second semiconductor device 107, and all such processes are fully intended to be included within the scope of the embodiments.

Figure 1C:
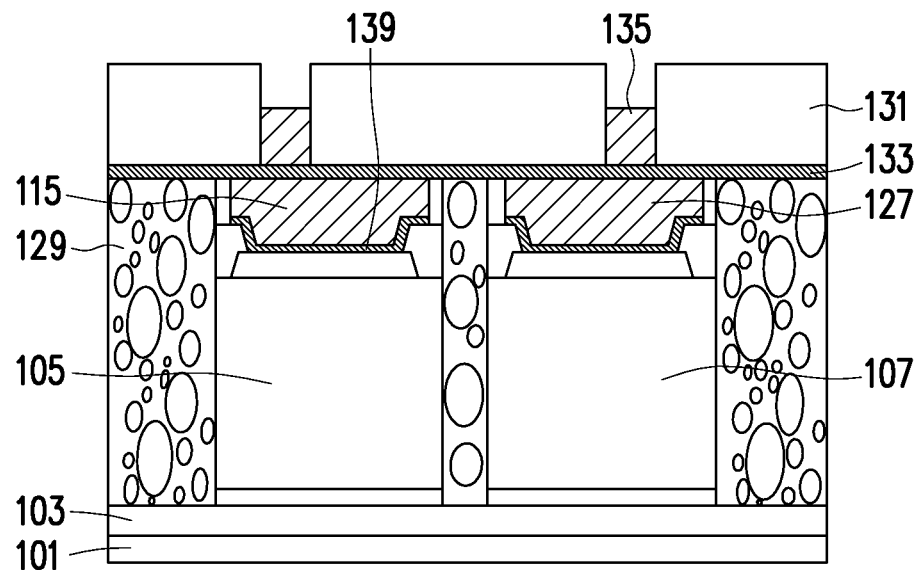

FIG. 1C illustrates formation of first vias 135 in contact with the first external connectors 115 on the first semiconductor device 105 and in contact with the second external connectors 127 on the second semiconductor device 107. In an embodiment the process to form the first vias 135 may be performed using, e.g., a masking and plating process or a damascene process. In an embodiment in which a masking and plating process is utilized to form the first vias 135, the masking and plating process may be initiated by first forming a first seed layer 133. In an embodiment the first seed layer 133 is a thin layer of a conductive material that aids in the formation of a thicker layer during subsequent processing steps, such as titanium, copper, molybdenum, tungsten, titanium nitride, titanium tungsten, combinations thereof, or the like. In some embodiments, the first seed layer 133 comprises a titanium layer and a copper layer over the titanium layer. The first seed layer 133 may be formed using, for example, PVD, evaporation, or PECVD processes, or the like. The first seed layer 133 may be formed to have almost straight sidewalls and a thickness of between about 0.3 µm and about 1 µm, such as about 0.5 µm.

FIG. 1C also illustrates a placement and patterning of a photoresist 131 over the first seed layer 133. In an embodiment the photoresist 131 may be placed on the first seed layer 133 using, e.g., a spin coating technique. Once in place, the photoresist 131 may then be patterned by exposing the photoresist to a patterned energy source (e.g., a patterned light source) so as to induce a chemical reaction, thereby inducing a physical change in those portions of the photoresist 131 exposed to the patterned light source. A developer is then applied to the exposed photoresist 131 to take advantage of the physical changes and selectively remove either the exposed portion of the photoresist 131 or the unexposed portion of the photoresist 131, depending upon the desired pattern.

In an embodiment the first vias 135 are formed within the photoresist 131. In an embodiment the first vias 135 comprise one or more conductive materials, such as copper, tungsten, other conductive metals, or the like, and may be formed, for example, by electroplating, electroless plating, or the like. In an embodiment, an electroplating process is used wherein the first seed layer 133 and the photoresist 131 are submerged or immersed in an electroplating solution. The first seed layer 133 surface is electrically connected to the negative side of an external DC power supply such that the first seed layer 133 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 133, acquires the dissolved atoms, thereby plating the exposed conductive areas of the first seed layer 133 within the opening of the photoresist 131.

In another embodiment, the first vias 135 include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold. Any suitable materials or layers of material that may be used for the first vias 135 are fully intended to be included within the scope of the current application.

Figure 1D:
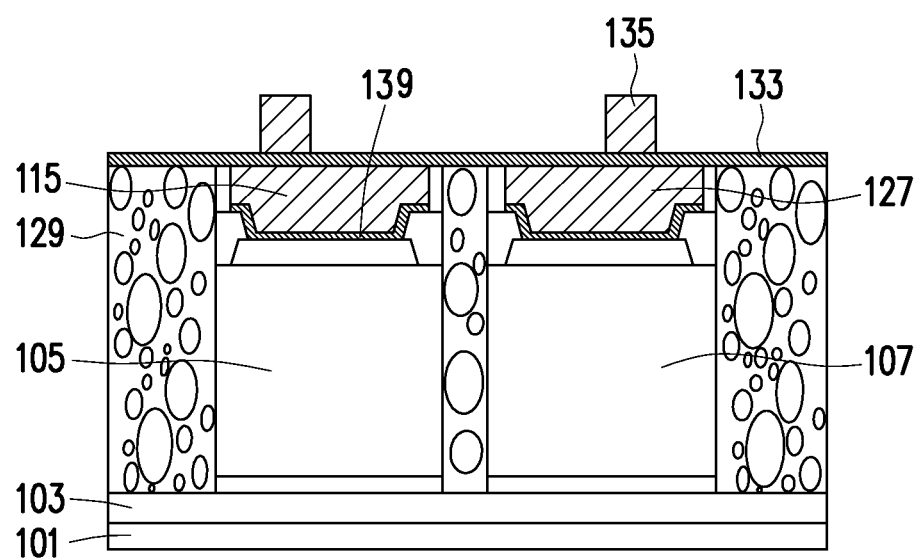

FIG. 1D illustrates that once the first vias 135 have been formed using the photoresist 131 and the first seed layer 133, the photoresist 131 may be removed using a suitable removal process. In an embodiment, a plasma ashing process may be used to remove the photoresist 131, whereby the temperature of the photoresist 131 may be increased until the photoresist 131 experiences a thermal decomposition and may be removed. However, any other suitable process, such as a wet strip, may alternatively be utilized. The removal of the photoresist 131 may expose the underlying portions of the first seed layer 133.

Figure 1E:
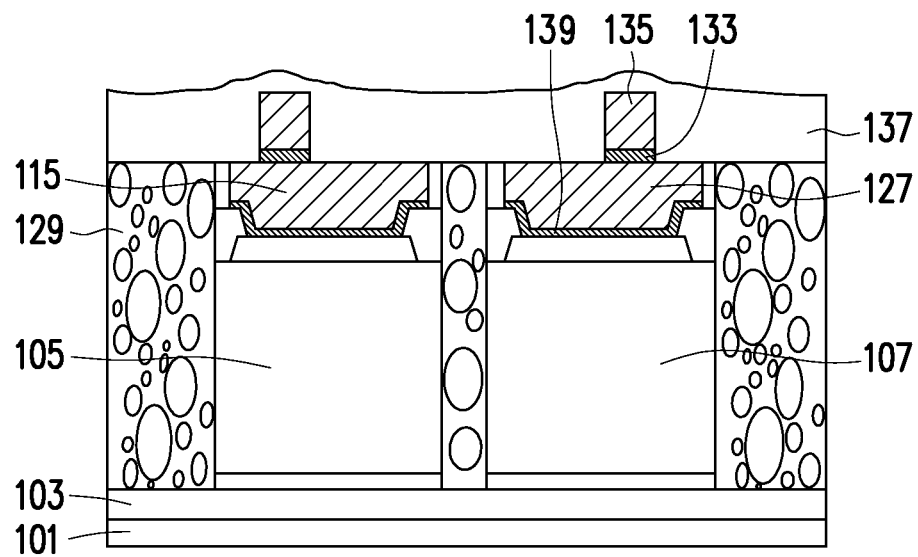

FIG. 1E illustrates a removal of the exposed portions of the first seed layer 133. In an embodiment the exposed portions of the first seed layer 133 (e.g., those portions that are not covered by the first vias 135) may be removed by, for example, a wet or dry etching process. For example, in a dry etching process reactants may be directed towards the first seed layer 133 using the first vias 135 as masks. In another embodiment, etchants may be sprayed or otherwise put into contact with the first seed layer 133 in order to remove the exposed portions of the first seed layer 133.

FIG. 1E additionally illustrates that, once the first seed layer 133 is etched, the first vias 135 are coated with a first dielectric material 137. In an embodiment the first dielectric material 137 may be a polymer, such as polybenzoxazole (PBO), polyimide, benzocyclobutene (BCB), or the like. In other embodiments, the first dielectric material 137 is formed of a nitride such as silicon nitride; an oxide such as silicon oxide, phosphosilicate glass (PSG), borosilicate glass (BSG), boron-doped phosphosilicate glass (BPSG), or the like. The first dielectric material 137 may be formed by any acceptable deposition process, such as spin coating, chemical vapor deposition (CVD), laminating, the like, or a combination thereof.

Figure 1F:
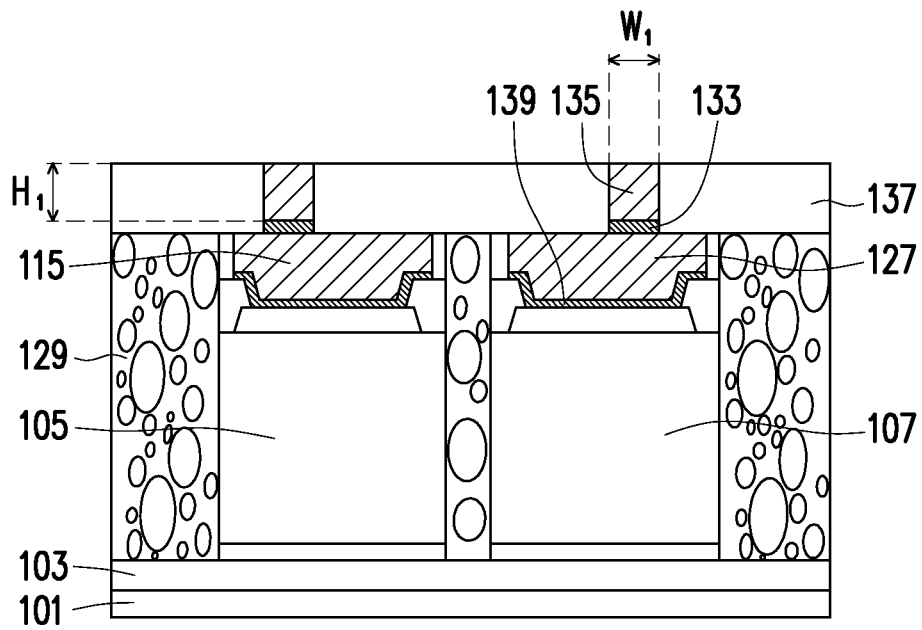

FIG. 1F illustrates that, once the first dielectric material 137 is cured, the first dielectric material 137 may be planarized. The planarizing may be performed, e.g., using a mechanical grinding, chemical approaches, or chemical mechanical polishing (CMP) process whereby chemical etchants and abrasives are utilized to react and grind away the first dielectric material 137 until the first vias 135 have been exposed. As such, the first dielectric material 137 and the first vias 135 may have a planar surface.

However, while the CMP, mechanical grinding, or chemical approach processes described above are presented as illustrative embodiments, it is not intended to be limiting to the embodiments. Any other suitable removal process may alternatively be used to planarize the first dielectric material 137 and expose the first vias 135. For example, a series of chemical etches may be utilized. This process and any other suitable process may alternatively be utilized to planarize the first dielectric material 137 and expose the first vias 135, and all such processes are fully intended to be included within the scope of the embodiments.

Figure 1G:
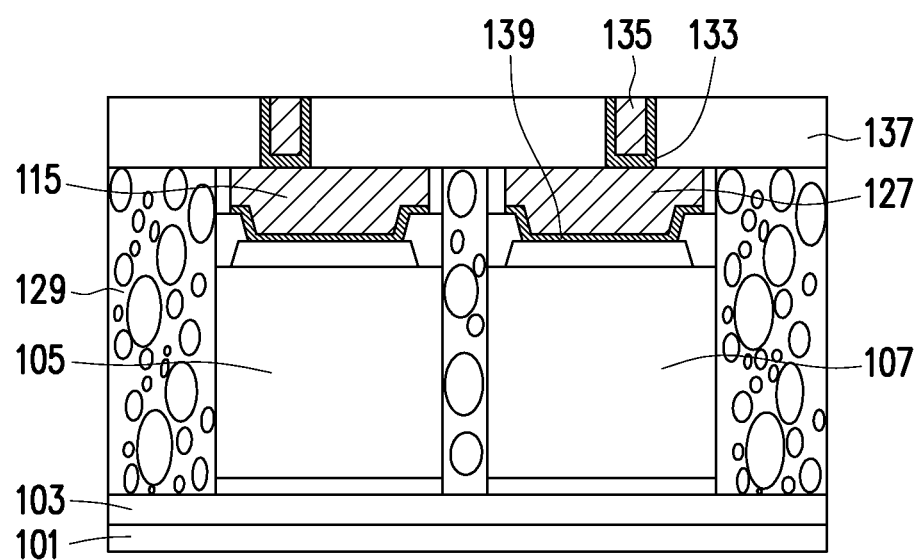

FIG. 1G illustrates an embodiment in which the first vias 135 are formed using a damascene process. In this embodiment the first seed layer 133 is not deposited and the first dielectric material 137 may be deposited prior to the formation of the first vias 135. In an embodiment the first dielectric material 137 may be deposited as described above (e.g., through a chemical vapor deposition process), and then planarized to help ensure that a flat surface is ready for further manufacturing.

Once the first dielectric material 137 is deposited and planarized, the first dielectric material 137 may be patterned to form openings for the first vias 135. In an embodiment the first dielectric material 137 may be patterned by initially applying a photoresist over the unpatterned first dielectric material 137, and then exposing and developing the photoresist in order to form the desired pattern for the first vias 135. Once the photoresist is patterned, the pattern is then transferred to the underlying first dielectric material 137 using, e.g., an anisotropic etching process such as a reactive ion etch in order to expose the underlying second external connectors 127. However, any suitable method of patterning the first dielectric material 137 may be utilized.

After the second external connectors 127 have been exposed, the openings through the first dielectric material 137 are then filled with a conductive material. In an embodiment a seed layer may be deposited along with one or more barrier layers. In an embodiment the seed layer may be similar to the first seed layer 133, such as by being a titanium layer and a copper layer over the titanium layer that have been deposited using, e.g., physical vapor deposition to line the bottom and sidewall surfaces of the openings. However, any suitable materials and deposition process may be utilized.

Once the seed layer is formed, conductive material may be deposited to fill and overfill the openings. In an embodiment the conductive material may be copper that is deposited using a electroplating or electroless plating process that utilizes the seed layer, and the process may be continued until the conductive material fills and/or overfills the openings within the first dielectric layer 137. However, any suitable material and process may be utilized in order to fill the openings with the conductive material.

After the openings have been filled, any excess portions of the conductive material that are located outside of the openings through the first dielectric material 137 are removed to form the first vias 135. In an embodiment the excess portions may be removed using, e.g., a planarizing process such as a chemical mechanical polishing process, a grinding process, other chemical processes, combinations of these, or the like. However, any suitable process of embedding the conductive material into the first dielectric material 137 and forming the first vias 135 may be utilized.

In an embodiment, once the first vias 135 have been planarized, the first vias 135 may be formed to have a first width $W_1$ of between about 0.1 μm and about 20 μm, such as about 5 μm. Similarly, the first vias 135 may be formed to have a first height $H_1$ (over the first seed layer 133) of between about 0.1 μm and about 20 μm, such as about 5 μm. However, any suitable dimensions may be utilized.

Figure 2A:
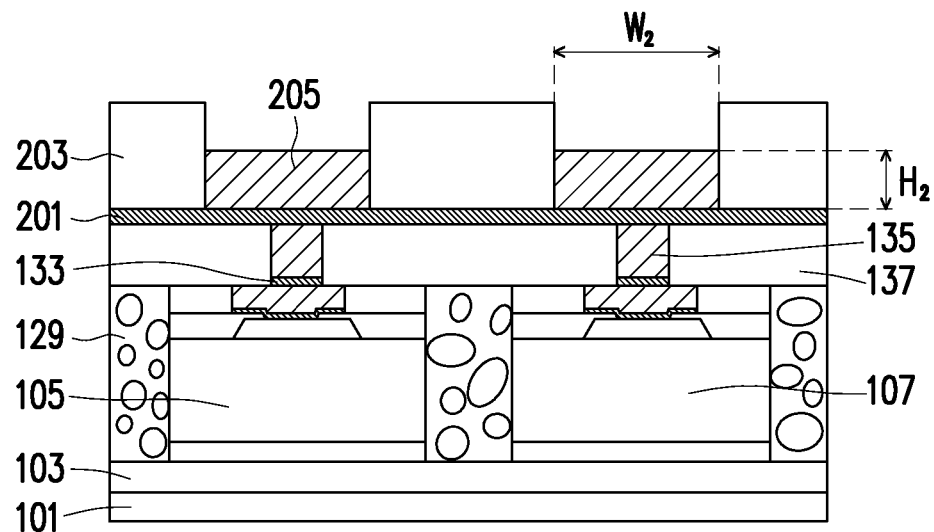

FIG. 2A illustrates the beginning of a formation of a first metallization layer 205 (otherwise known as a redistribution layer) over the first vias 135 using either a plating process or a damascene process. In an embodiment in which a plating process is utilized, a second seed layer 201 is formed over the first dielectric material 137. The second seed layer 201 may be similar to the first seed layer 133. For example, the second seed layer 201 may be created using processes such as sputtering, evaporation, or PECVD processes, depending upon the desired materials. The second seed layer 201 may be formed to have a thickness of between about 0.01 μm and about 1 μm, such as about 0.5 μm.

FIG. 2A also illustrates a placement and patterning of a second photoresist 203 over the second seed layer 201. In an embodiment the second photoresist 203 may be a dry or wet photoresist and may be placed on the second seed layer 201 using, e.g., a spin coating technique. Once in place, the second photoresist 203 may then be patterned by exposing the second photoresist 203 to a patterned energy source (e.g., a patterned light source) so as to induce a chemical reaction, thereby inducing a physical change in those portions of the second photoresist 203 exposed to the patterned light source. A developer is then applied to the exposed second photoresist 203 to take advantage of the physical changes and selectively remove either the exposed portion of the second photoresist 203 or the unexposed portion of the second photoresist 203, depending upon the desired pattern.

Once the second photoresist 203 is patterned, the first metallization layer 205 may be formed on the second seed layer 201 within the second photoresist 203. In an embodiment the first metallization layer 205 comprises one or more conductive materials, such as copper, tungsten, other conductive metals, or the like, and may be formed, for example, by electroplating, electroless plating, or the like. In an embodiment, an electroplating process is used wherein the second seed layer 201 and the second photoresist 203 are submerged or immersed in an electroplating solution. The second seed layer 201 surface is electrically connected to the negative side of an external DC power supply such that the second seed layer 201 functions as the cathode in the electroplating process when a current is run through the second seed layer 201. A solid conductive anode, such as a copper anode, is also immersed in the solution and is attached to the positive side of the power supply. The atoms from the anode are dissolved into the solution, from which the cathode, e.g., the second seed layer 201, acquires the dissolved atoms, thereby plating the exposed conductive areas of the second seed layer 201 within the opening of the second photoresist 203.

In another embodiment, the first metallization layer 205 includes three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold. Any suitable materials or layers of material that may be used for the first metallization layer 205 are fully intended to be included within the scope of the current application.

In an embodiment, once the first metallization layer 205 is formed, the first metallization layer 205 may be formed to have a second width $W_2$ that is larger than the first width $W_1$ (of the first vias 135), and may be between about 0.1 μm and about 10 μm, such as about 0.7 μm. Similarly, the first metallization layer 205 may be formed to have a second height $H_2$ (over the second seed layer 201) of between about 0.05 μm and about 20 μm, such as about 1 μm. However, any suitable dimensions may be utilized.

Additionally, in some embodiments the first metallization layer 205 may be formed to include a pad portion for connection with an overlying via (e.g., the second vias 209). The pad portion may be wider than the remaining portion of the first metallization layer 205 and may also be formed to be larger than or equal to the overlying via size. However, any suitable dimensions may be utilized.

Figure 2B:
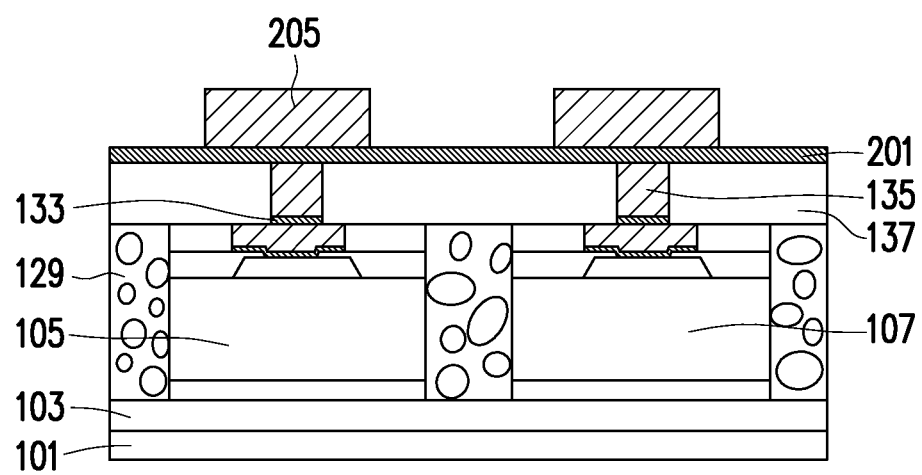

FIG. 2B illustrates that, once the first metallization layer 205 is formed, the second photoresist 203 may be removed using a suitable removal process. In an embodiment, a plasma ashing process may be used to remove the second photoresist 203, whereby the temperature of the second photoresist 203 may be increased until the second photoresist 203 experiences a thermal decomposition and may be removed. However, any other suitable process, such as a wet strip, may alternatively be utilized.

Optionally, at this point the first metallization layer 205 may be treated. In a particular embodiment the first metallization layer 205 may be treated in order to prepare the first metallization layer 205 for the formation of second vias 209 (discussed further below). In an embodiment the surface treatment may be a descum treatment such as a plasma treatment wherein the surface of the first metallization layer 205 is exposed to a plasma of, e.g., argon, nitrogen, oxygen or a mixed $Ar/N_2/O_2$ ambient environment in order to improve the interface adhesion between the first metallization layer 205 and overlying layers (e.g., the second vias 209). However, any suitable surface treatment may be utilized.

Figure 2C:
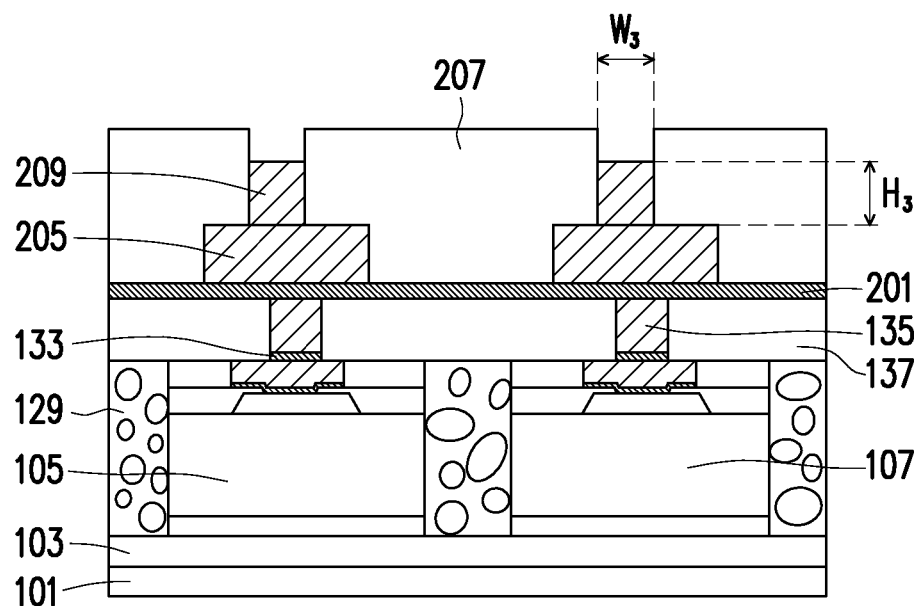

FIG. 2C illustrates a placement of a third photoresist 207 over the first metallization layer 205. In an embodiment the third photoresist 207 may be a dry or wet photoresist and may be placed on the first metallization layer 205 using, e.g., a spin coating technique. Once in place, the third photoresist 207 may then be patterned by exposing the third photoresist 207 to a patterned energy source (e.g., a patterned light source) so as to induce a chemical reaction, thereby inducing a physical change in those portions of the third photoresist 207 exposed to the patterned light source. A developer is then applied to the exposed third photoresist 207 to take advantage of the physical changes and selectively remove either the exposed portion of the third photoresist 207 or the unexposed portion of the third photoresist 207, depending upon the desired pattern.

In another embodiment the second photoresist 203 is not removed prior to the placement of the third photoresist 207. Rather, the third photoresist 207 is placed over the second photoresist 203 and into the openings formed by the second photoresist 203. Such an embodiment allows for a similar process without the need of the additional ashing process to remove the second photoresist 203.

In an embodiment the third photoresist 207 is developed to form a pattern for second vias 209 which exposes a top surface of the first metallization layer 205, wherein the pattern will include straight and vertical or almost vertical sidewalls through the third photoresist 207. Once the first metallization layer 205 is exposed through the third photoresist 207, the second vias 209 may be formed within the third photoresist 207. In an embodiment the second vias 209 comprise one or more conductive materials, such as copper, tungsten, other conductive metals, or the like, and may be formed, for example, by electroplating, electroless plating, or the like. In an embodiment, an electroplating process is used wherein the first metallization layer 205 and the third photoresist 207 are submerged or immersed in an electroplating solution. The second seed layer 201 (and, thereby, also the first metallization layer 205) is electrically connected to the negative side of an external DC power supply such that the first metallization layer 205 functions as the cathode in the electroplating process when a current is again run through the second seed layer 201. A solid conductive anode, such as a copper anode, is also immersed in the solution and is attached to the positive side of the power supply. The atoms from the anode are dissolved into the solution, from which the cathode, e.g., the combined second seed layer 201 and first metallization layer 205, acquires the dissolved atoms, thereby plating the exposed conductive areas of the first metallization layer 205 within the opening of the third photoresist 207 such that the second vias 209 take on the shape of the opening through the photoresist, including the straight sidewalls.

In another embodiment, the second vias 209 include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold. Any suitable materials or layers of material that may be used for the second vias 209 are fully intended to be included within the scope of the current application.

By forming the second vias 209 as described, the second vias 209 can be formed directly onto the first metallization layer 205. This allows the second vias 209 to be formed without the need for yet another seed layer. As such, both the first metallization layer 205 and the second vias 209 may be formed using a single seed layer (e.g., the second seed layer 201). Additionally, the second vias 209 are fully or partially landed on the material of the first metallization layer 205.

In an embodiment, once the second vias 209 have been formed on the first metallization layer 205, the second vias 209 may be formed to have a third width $W_3$ that is smaller than the second width $W_2$ (of the first metallization layer 205) and may be between about 0.1 µm and about 20 µm, such as about 5 µm. Similarly, the second vias 209 may be formed to have a third height $H_3$ of between about 0.1 µm and about 20 µm, such as about 5 µm. However, any suitable dimensions may be utilized.

Figure 2D:
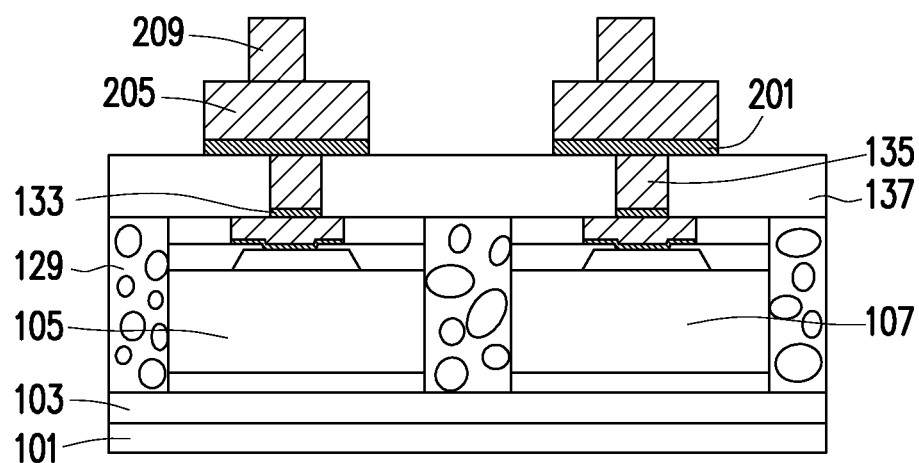

FIG. 2D illustrates that, once the second vias 209 have been formed, the third photoresist 207 may be removed using a suitable removal process. In an embodiment, a plasma ashing process may be used to remove the third photoresist 207, whereby the temperature of the third photoresist 207 may be increased until the third photoresist 207 experiences a thermal decomposition and may be removed. However, any other suitable process, such as a wet strip, may alternatively be utilized.

FIG. 2D additionally illustrates a removal of the exposed portions of the second seed layer 201. In an embodiment the exposed portions of the second seed layer 201 may be removed by, for example, a wet or dry etching process. For example, in a dry etching process reactants may be directed towards the second seed layer 201 using the first metallization layer 205 as masks. In another embodiment, etchants may be sprayed or otherwise put into contact with the second seed layer 201 in order to remove the exposed portions of the second seed layer 201.

Figure 2E:
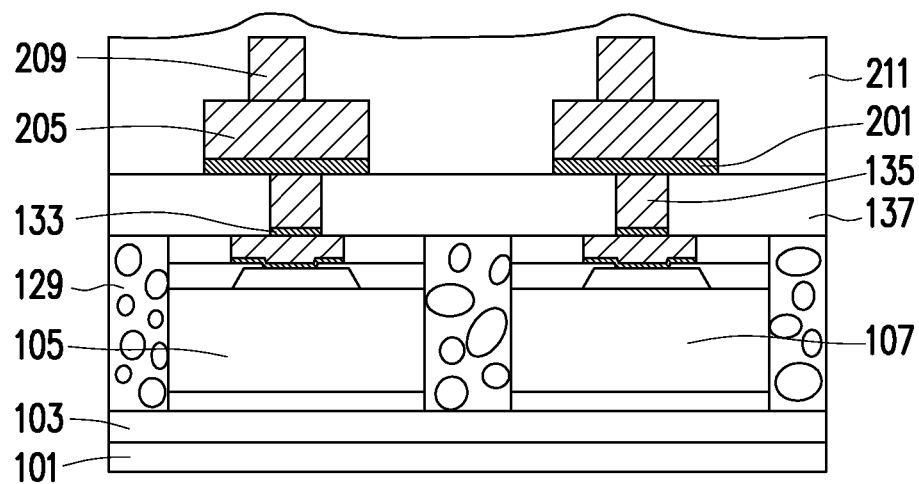

FIG. 2E illustrates that, once the second seed layer 201 is etched, the first metallization layer 205 and the second vias 209 are coated with a second dielectric material 211. In an embodiment the second dielectric material 211 may be similar to first dielectric material 137 (described above with respect to FIG. 1E), although any suitable material, such as polyimide or a polyimide derivative, may be utilized. The second dielectric material 211 may be placed using, e.g., a spin-coating process to a thickness of greater than about 1 µm or greater than about 20 µm, such as about 7 µm, although any suitable method and thickness may alternatively be used. Once in place, the second dielectric material 211 may be cured.

Figure 2F:
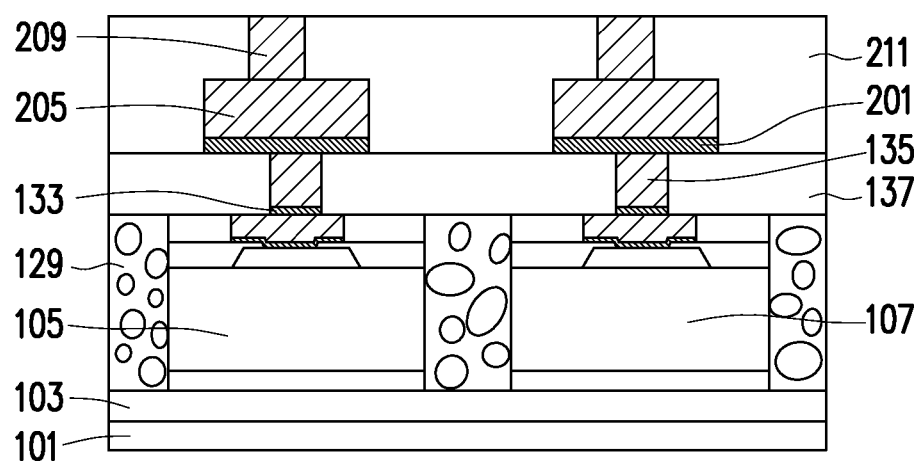

FIG. 2F illustrates that, once the second dielectric material 211 is cured, the second dielectric material 211 may be planarized. The planarizing may be performed, e.g., using a mechanical grinding, chemical approaches, or chemical mechanical polishing (CMP) process whereby chemical etchants and abrasives are utilized to react and grind away the second dielectric material 211 until the second vias 209 have been exposed. As such, the second dielectric material 211 and the second vias 209 may have a planar surface.

However, while the CMP process described above is presented as one illustrative embodiment, it is not intended to be limiting to the embodiments. Any other suitable removal process may alternatively be used to planarize the second dielectric material 211 and expose the second vias 209. For example, a series of chemical etches may be utilized. This process and any other suitable process may alternatively be utilized to planarize the second dielectric material 211 and expose the second vias 209, and all such processes are fully intended to be included within the scope of the embodiments.

Figure 2G:
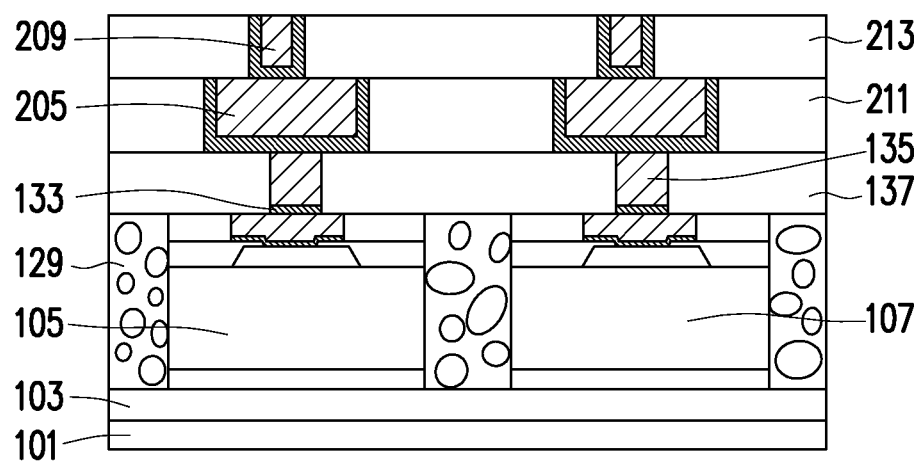

FIG. 2G illustrates the embodiment in which the first metallization layer 205 and the second vias 209 are formed using a damascene process. In this embodiment, instead of the second seed layer 201 being formed first, the second dielectric material 211 is initially deposited directly onto the first dielectric material 137 and the first vias 135. For example, the second dielectric material 211 may be formed as a polyimide derivative, and using e.g., a spin-coating process. However, any suitable material and method of deposition may be utilized.

Once the second dielectric material 211 is placed, the second dielectric material 211 may be patterned in order to form the desired shape for the first metallization layer 205. In an embodiment the second dielectric material 211 may be patterned by initially applying and then exposing and developing a photoresist in order to form a pattern in the shape desired for first metallization layer 205.

Once the pattern is defined into the photoresist, the pattern of the photoresist may be transferred to the underlying second dielectric material 211. In an embodiment the pattern may be transferred utilizing, e.g., an anisotropic etching process such as a reactive ion etch which removes exposed material of the second dielectric material 211 and exposes the underlying first vias 135. However, any suitable process may be used to transfer the pattern.

After the first vias 135 have been exposed, the openings through the second dielectric material 211 are then filled with a conductive material. In an embodiment a seed layer may be deposited along with one or more barrier layers. In an embodiment the seed layer may be similar to the first seed layer 133, such as by being a titanium layer and a copper layer over the titanium layer that have been deposited using, e.g., physical vapor deposition to line the bottom and sidewall surfaces of the openings. However, any suitable materials and deposition process may be utilized.

Once the seed layer is formed, conductive material may be deposited to fill and overfill the openings. In an embodiment the conductive material may be copper that is deposited using a electroplating or electroless plating process that utilizes the seed layer, and the process may be continued until the conductive material fills and/or overfills the openings within the second dielectric material 211. However, any suitable material and process may be utilized in order to fill the openings with the conductive material.

After the openings have been filled, any excess portions of the conductive material that are located outside of the openings through the second dielectric material 211 are removed to form the first metallization layer 205. In an embodiment the excess portions may be removed using, e.g., a planarizing process such as a chemical mechanical polishing process, a grinding process, other chemical processes, combinations of these, or the like. However, any suitable process of embedding the conductive material into the second dielectric material 211 and forming the first metallization layer 205 may be utilized.

FIG. 2G additionally illustrates that, once the first metallization layer 205 is formed, the second vias 209 may also be formed utilizing a damascene process. For example, once the first metallization layer 205 is formed, a second via dielectric layer 213 may be deposited over the first metallization layer 205. In an embodiment the second via dielectric layer 213 may be a similar material and deposited using a similar process as the second dielectric material 211, such as by being formed as a polyimide derivative, and using, e.g., a spin-coating process. However, any suitable material and method of deposition may be utilized.

Once the second via dielectric layer 213 is placed, the second via dielectric layer 213 may be patterned in order to form the desired shape for the second vias 209. In an embodiment the second via dielectric layer 213 may be patterned by initially applying and then exposing and developing a photoresist in order to form a pattern in the shape desired for second vias 209.

Once the pattern is defined into the photoresist, the pattern of the photoresist may be transferred to the underlying second via dielectric layer 213. In an embodiment the pattern may be transferred utilizing, e.g., an anisotropic etching process such as a reactive ion etch which removes exposed material of the second via dielectric layer 213 and exposes the underlying first metallization layer 205. However, any suitable process may be used to transfer the pattern.

After the first metallization layer 205 is exposed, the openings through the second via dielectric layer 213 are then filled with a conductive material. In an embodiment a seed layer may be deposited along with one or more barrier layers. In an embodiment the seed layer may be similar to the first seed layer 133, such as by being a titanium layer and a copper layer over the titanium layer that have been deposited using, e.g., physical vapor deposition to line the bottom and sidewall surfaces of the openings. However, any suitable materials and deposition process may be utilized.

Once the seed layer is formed, conductive material may be deposited to fill and overfill the openings. In an embodiment the conductive material may be copper that is deposited using a electroplating or electroless plating process that utilizes the seed layer, and the process may be continued until the conductive material fills and/or overfills the openings within the second via dielectric layer 213. However, any suitable material and process may be utilized in order to fill the openings with the conductive material.

After the openings have been filled, any excess portions of the conductive material that are located outside of the openings through the second via dielectric layer 213 are removed to form the second vias 209. In an embodiment the excess portions may be removed using, e.g., a planarizing process such as a chemical mechanical polishing process, a grinding process, other chemical processes, combinations of these, or the like. However, any suitable process of embedding the conductive material into the second via dielectric layer 213 and forming the second vias 209 may be utilized.

Figure 3:
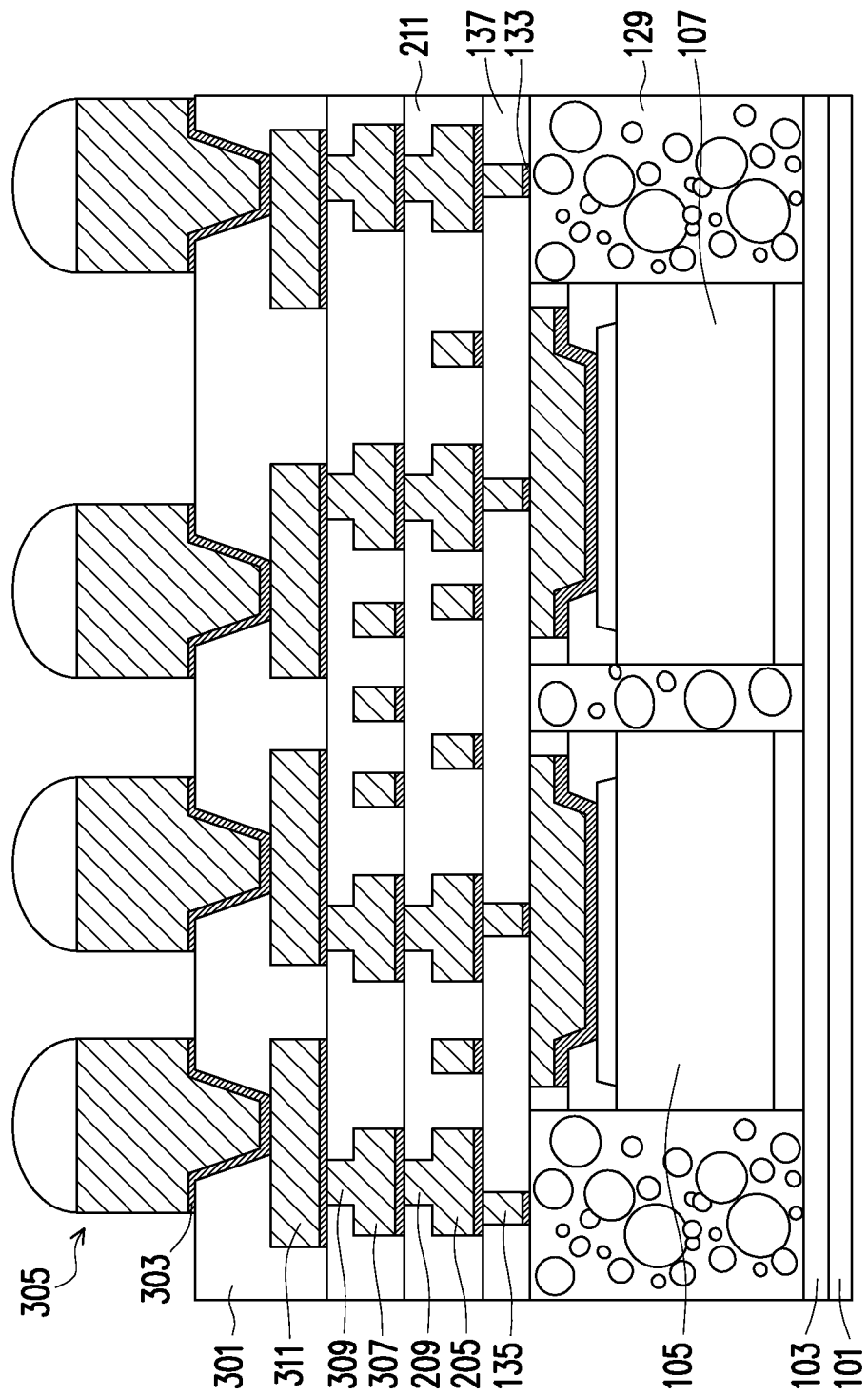

FIG. 3 illustrates that, once the first metallization layer 205 and the second vias 209 have been formed, similar processes may be repeated in order to form a second metallization layer 307 and a third via 309 (both formed using a single seed layer) and a third metallization layer 311, each within different dielectric layers. Further, once the third metallization layer 311 is formed a passivation layer 301 may be formed and patterned, underbump metallizations 303 may be formed, and third external connectors 305 may be placed. In an embodiment the passivation layer 301 may be made of one or more suitable dielectric materials such as polybenzoxazole (PBO), although any suitable material, such as polyimide or a polyimide derivative, silicon nitride, silicon oxide, or the like, may be utilized. The passivation layer 301 may be placed using, e.g., a spin-coating process to a thickness of between about 5 µm and about 25 µm, such as about 7 µm, although any suitable method and thickness may alternatively be used.

In an embodiment the underbump metallizations 303 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 303. Any suitable materials or layers of material that may be used for the underbump metallizations 303 are fully intended to be included within the scope of the embodiments.

In an embodiment the underbump metallizations 303 are created using a plating process, such as electrochemical plating, although other processes of formation, such as sputtering, evaporation, or PECVD process, may be used depending upon the desired materials. The underbump metallizations 303 may be formed to have a thickness of between about 0.7 µm and about 10 µm, such as about 5 µm.

Once the underbump metallizations 303 have been formed, the third external connectors 305 may be BGA connectors, copper bumps, solder balls, metal pillars, controlled collapse chip connection (C4) bumps, micro bumps, electroless nickel-electroless palladium-immersion gold technique (ENEPIG) formed bumps, combinations of these, or the like. The conductive connectors may include a conductive material such as solder, copper, aluminum, gold, nickel, silver, palladium, tin, the like, or a combination thereof. However, any suitable material or combination of materials may be utilized.

Additionally, while the embodiments described above with respect to FIGS. 1-3 describe an embodiment which utilizes the first metallization layer 205 and the second metallization layer 307, this number of metallization layers (and their respective vias) is intended to be illustrative only and is not intended to be limiting upon the embodiments. Rather, any suitable number of metallization layers and vias may be utilized, and all such numbers, such as 3, 4, 5 or more layers, are fully intended to be included within the scope of the embodiments.

Figure 4:
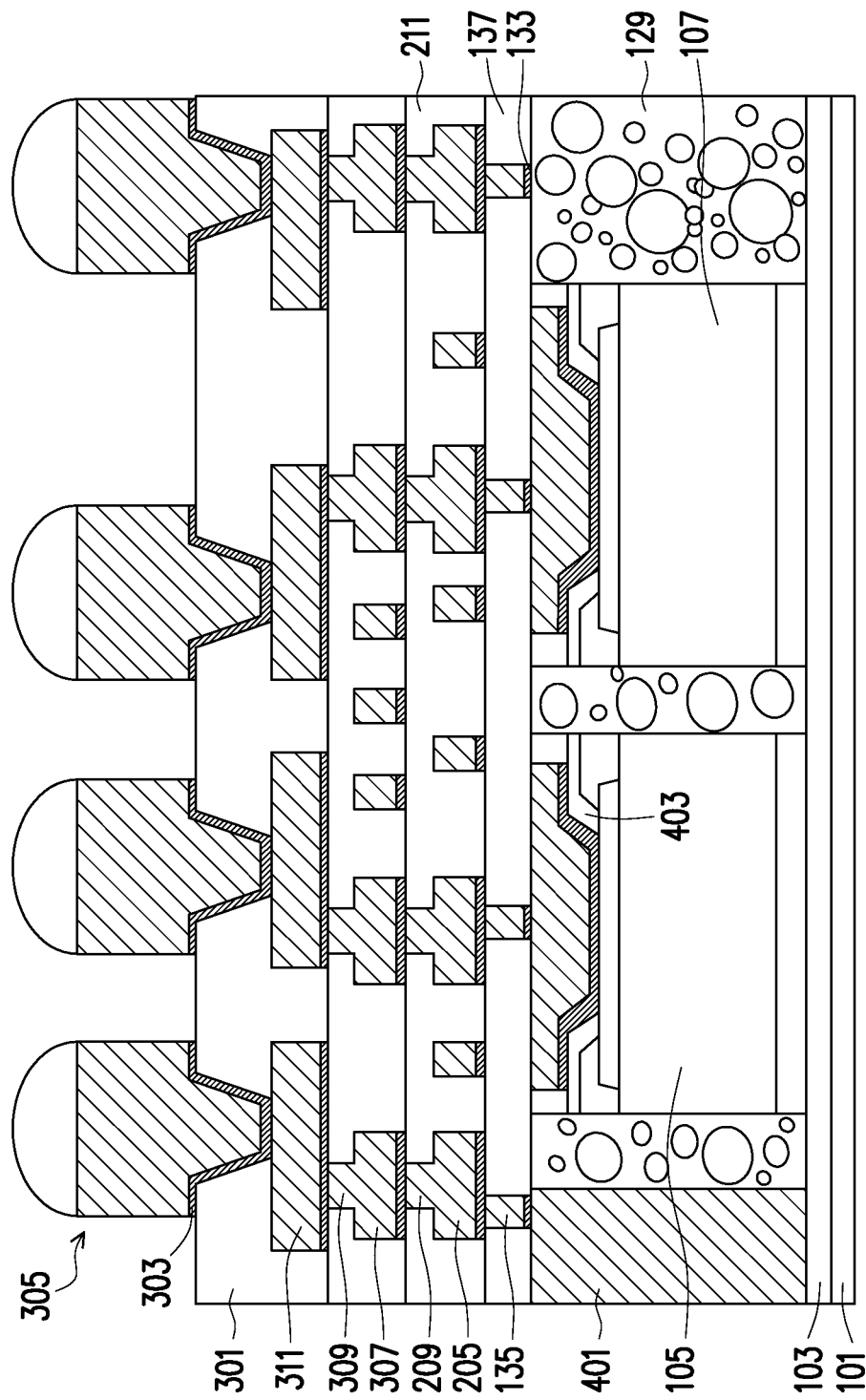

FIG. 4 illustrates other embodiments which may be utilized. For example, in the embodiment illustrated in FIG. 4, a through InFO via (TIV) 401 may be utilized in order to provide connectivity from one side of the encapsulant 129 to another side of the encapsulant 129. In an embodiment the TIV 401 may be formed on the polymer layer 103 prior to the placement of the first semiconductor device 105 and the second semiconductor device 107. For example, a seed layer may be placed on the polymer layer 103, and a photoresist may be placed and patterned over the seed layer to form openings in the desired shape of the TIVs 401. Once the photoresist is patterned, the TIV 401 may be plated within the openings and onto the exposed seed layer. After the TIV 401 is formed, the photoresist may be removed and the seed layer etched to leave behind the TIVs 401.

Once the TIVs 401 have been formed, the process may continue as described above to place the first semiconductor device 105 and the second semiconductor device 107. Additionally, the first vias 135, the first metallization layer 205, and the second vias 209 (along with a remainder of the metallization layers) may be formed. However, instead of some of the first vias 135 being connected to the encapsulant 129 (and thereby being dummy vias), the first vias 135 may be connected to the TIV 401, thereby providing electrical connectivity from one side of the encapsulant 129 to a second side of the encapsulant 129.

Additionally, FIG. 4 illustrates that a third passivation layer 403 may be formed between the first passivation layer 113 and the first external connectors 115. The third passivation layer 403 may be made of one or more suitable dielectric materials such as polybenzoxazole (PBO), although any suitable material, such as silicon nitride, silicon oxide, polyimide or a polyimide derivative, may alternatively be utilized. The third passivation layer 403 may be placed using, e.g., a spin-coating process to a thickness of between about 5 μm and about 25 μm, such as about 7 μm, although any suitable method and thickness may alternatively be used. Once in place, the third passivation layer 403 may be patterned prior to the formation of the first external connectors 115.

Figure 5:
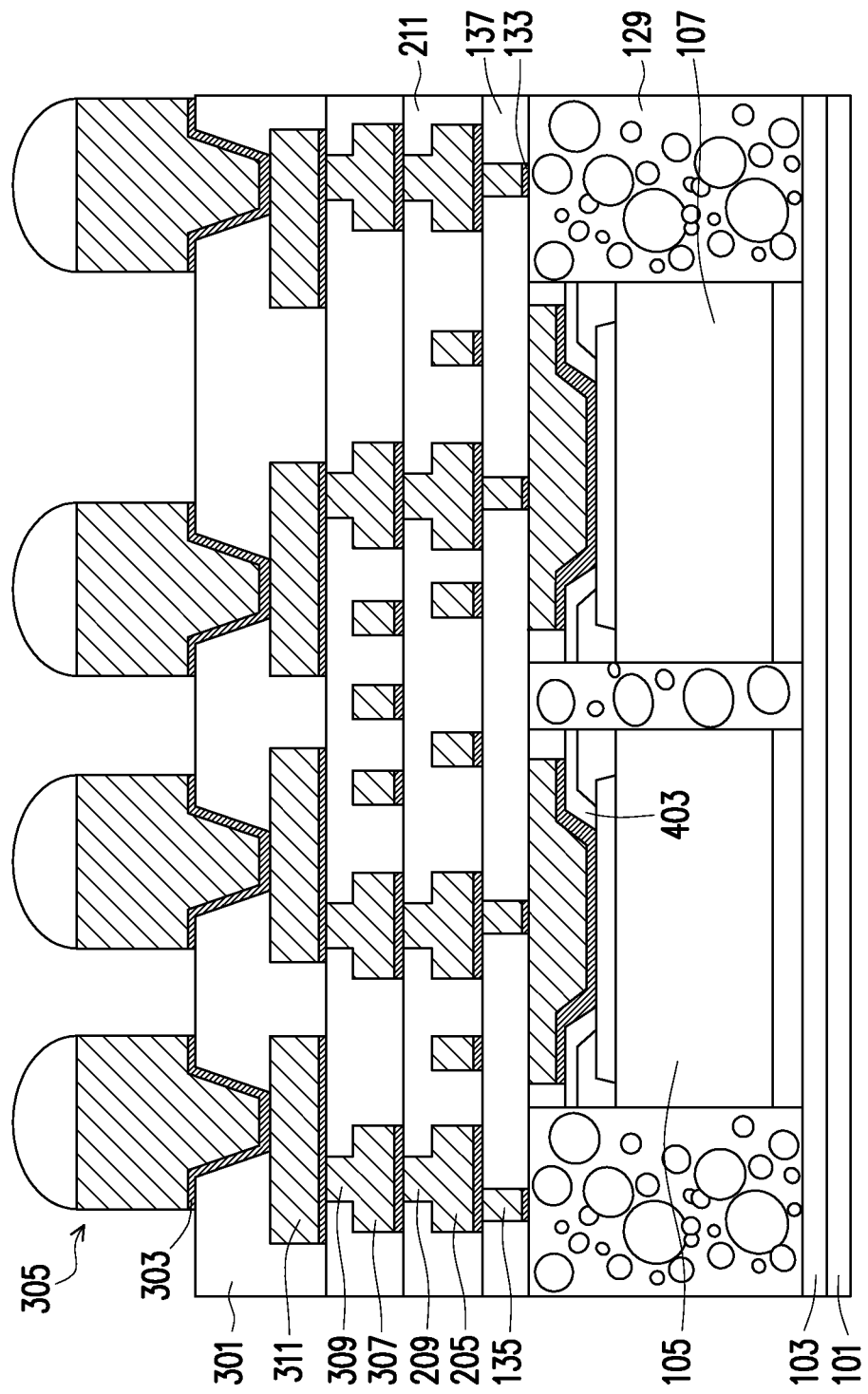

FIG. 5 illustrates another embodiment which utilizes the third passivation layer 403. However, in this embodiment the TIVs 401 are not formed. As such, some of the first vias 135 are formed over the encapsulant 129 and are not electrically connected to the first semiconductor device 105 or the second semiconductor device 107. Accordingly, the unconnected first vias 135 are dummy structures that are electrically isolated.

Figure 6:
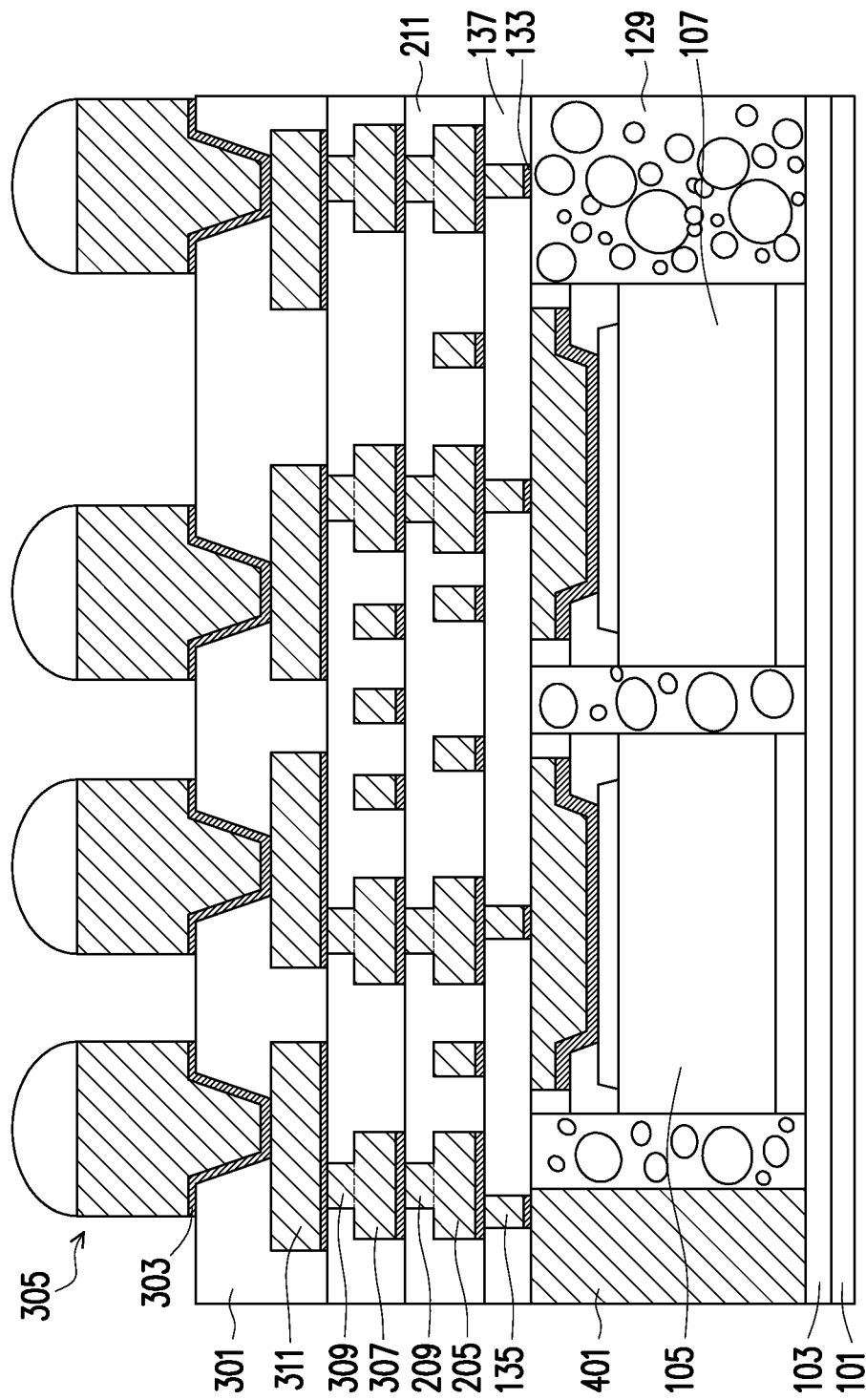

FIG. 6 illustrates another embodiment which utilizes the TIVs 401. However, in this embodiment the third passivation layer 403 is not formed. As such, some of the first vias 135 are formed in electrical connection with the TIVs 401. Such connections allow electrical conduction to the opposite side of the encapsulant 129.

Figure 7A:
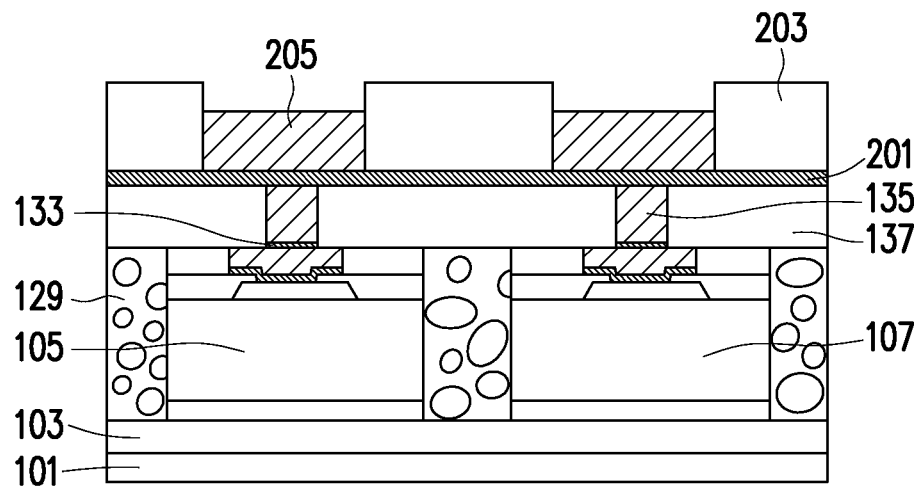
FIGS. 7A-11 illustrate partially landed vias in contact with a seed layer, in accordance with some embodiments.
Figure 7B:
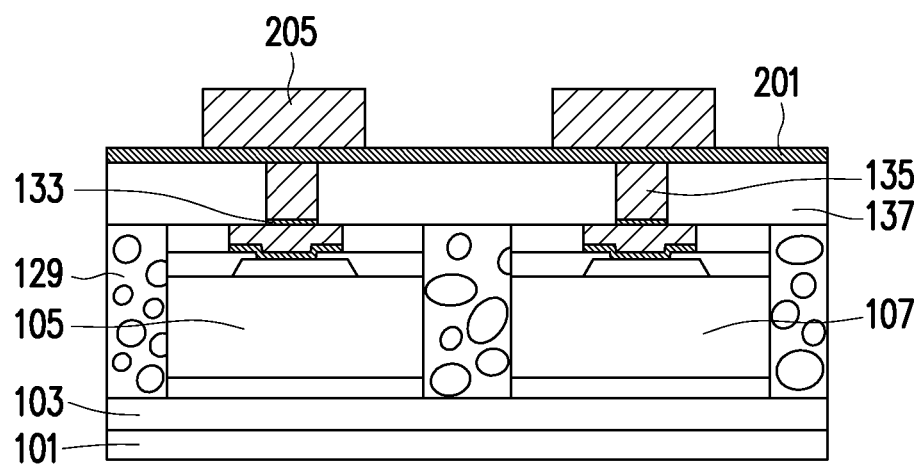

FIGS. 7A-7F illustrate another embodiment in which the second vias 209, instead of being formed fully landed on the first metallization layer 205, are formed being partially landed on the first metallization layer 205. In this embodiment, FIGS. 7A and 7B are similar to FIGS. 2A-2B as described above. As such, this description is not repeated.

Figure 7C:
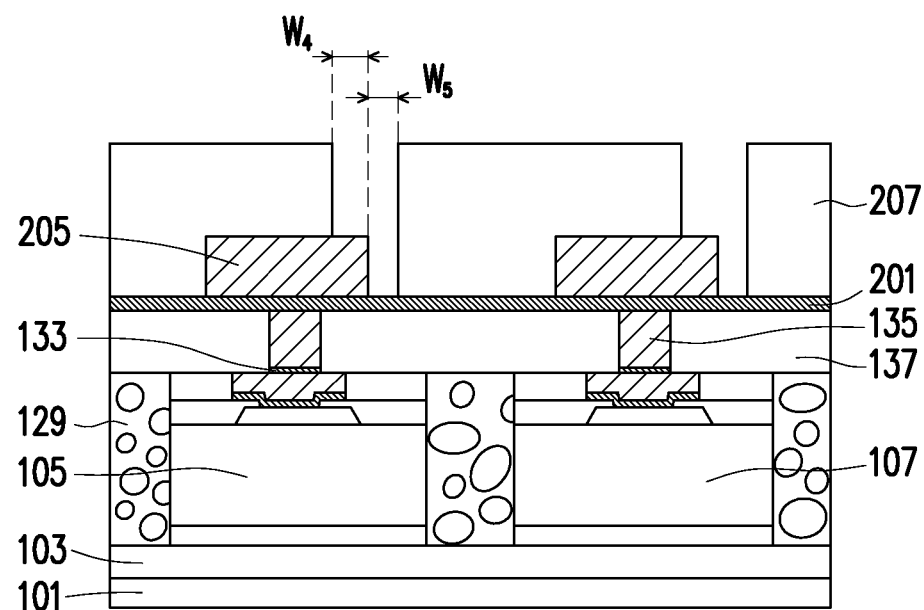

FIG. 7C illustrates a deposition and patterning of the third photoresist 207 over the first metallization layer 205. In an embodiment the third photoresist 207 may be deposited or placed and patterned as described above with respect to FIG. 2C, such as by exposing a developing the third photoresist 207 to form a pattern with straight and vertical or almost vertical sidewalls. However, in this embodiment, instead of being patterned to expose a top surface of the first metallization layer 205, the third photoresist 207 is patterned in order to expose both a portion of the top surface of the first metallization layer 205 and also expose a sidewall of the first metallization layer 205. Additionally, by fully exposing the sidewall of the first metallization layer 205, the underlying second seed layer 201 is also partially exposed as well.

In an embodiment the third photoresist 207 may be patterned such that the surface of the first metallization layer 205 that is exposed has a fourth width $W_4$ of between about 0.1 μm and about 20 μm, such as about 5 μm. Similarly, the third photoresist 207 is patterned such that the surface of the second seed layer 201 that is exposed has a fifth width $W_5$ of between about 0.1 μm and about 20 μm, such as about 5 μm. However, any suitable dimensions may be utilized.

Figure 7D:
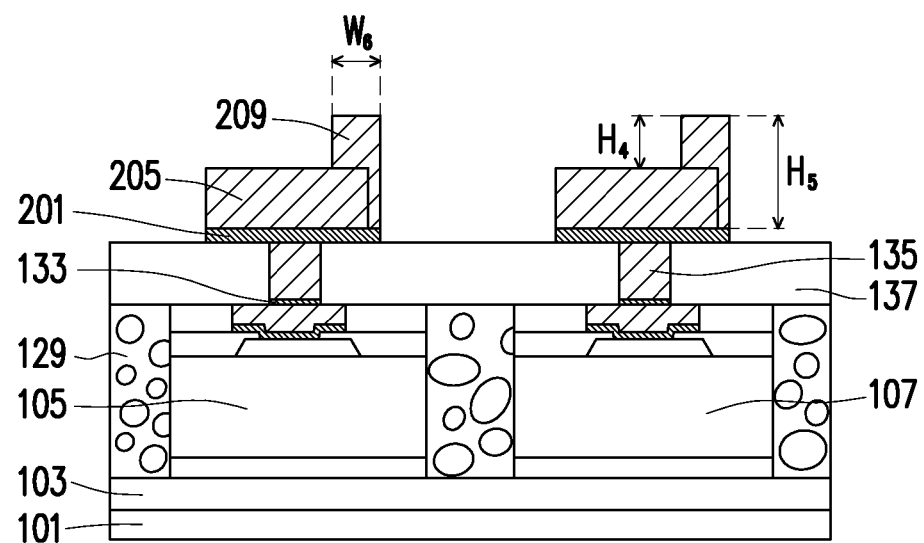

FIG. 7D illustrates a formation of the second vias 209 within the third photoresist 207. In an embodiment the formation of the second vias 209 may be performed as described above with respect to FIG. 2C. For example, the second vias 209 may be formed using an electroplating process which at least partially fills the openings in the third photoresist 207, wherein the first metallization layer 205 and the second vias 209 are formed using the same seed layer and in which the second vias 209 take on the shape of the pattern of the third photoresist 207, such as having straight and vertical or almost vertical sidewalls. In this embodiment, however, the material for the second vias 209 not only covers the top surface of the first metallization layer 205, but also covers at least one side surface of the first metallization layer 205 and is in physical contact with a portion of the second seed layer 201.

In this embodiment the second vias 209 may have a sixth width $W_6$ of between about 0.1 μm and about 20 μm, such as about 5 μm. Similarly, the second vias 209 in this embodiment may have a fourth height $H_4$ (over the second seed layer 201) of between about 0.01 μm and about 20 μm, such as about 3 μm, while the second vias 209 may have a fifth height $H_5$ (over the first metallization layer 205) of between about 0.05 μm and about 20 μm, such as about 5 μm. However, any suitable dimensions may be utilized.

FIG. 7D additionally illustrates a removal of the third photoresist 207. In an embodiment the third photoresist 207 may be removed as described above with respect to FIG. 2D. For example, an ashing process may be utilized to remove the third photoresist 207. However, any suitable process may be utilized to remove the third photoresist 207.

Finally, FIG. 7D also illustrates an etching of the second seed layer 201. In an embodiment the second seed layer 201 may be etched as described above with respect to FIG. 2D. For example, a wet or dry etching process may be utilized to remove the exposed portions of the second seed layer 201. However, any suitable process may be utilized.

Figure 7E:
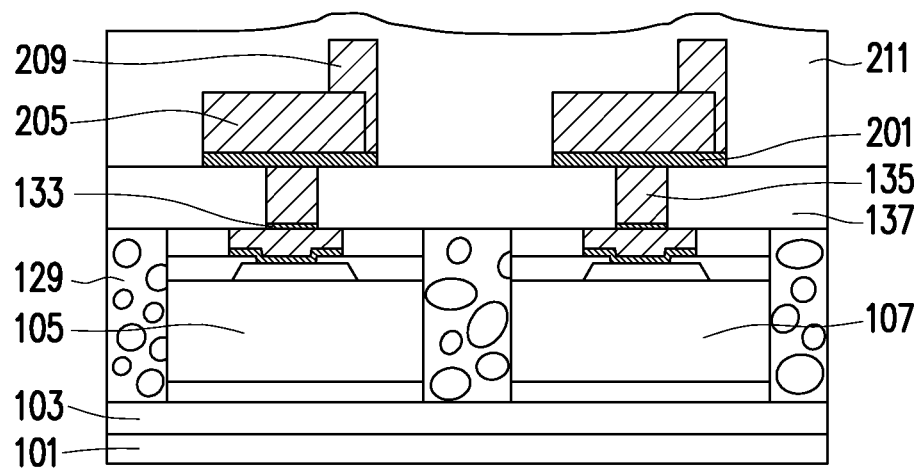
Figure 7F:
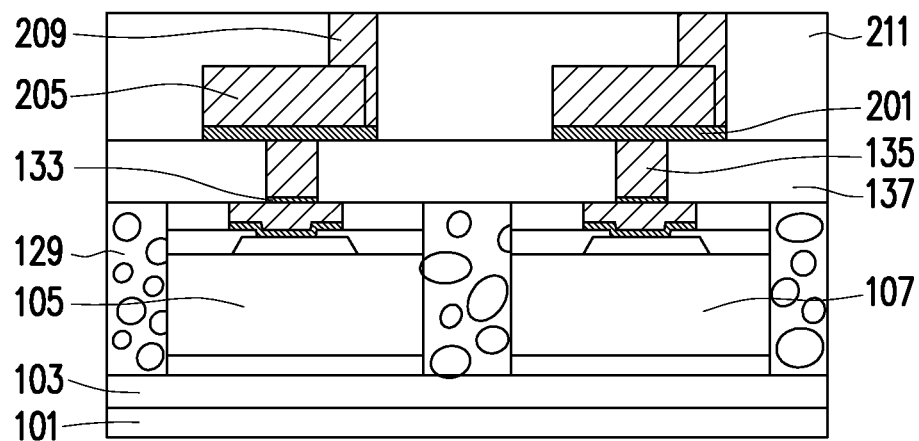

FIGS. 7E and 7F illustrate the placement and planarization of the second dielectric material 211 over the second vias 209. In an embodiment the second dielectric material 211 may be placed and planarized as described above with respect to FIGS. 2E and 2F. For example, the second dielectric material 211 may be deposited and cured, and then a CMP, mechanical grinding, or chemical approach processes may be utilized to planarize the second dielectric material 211 and expose the second vias 209. However, any suitable process may be utilized.

Figure 7G:
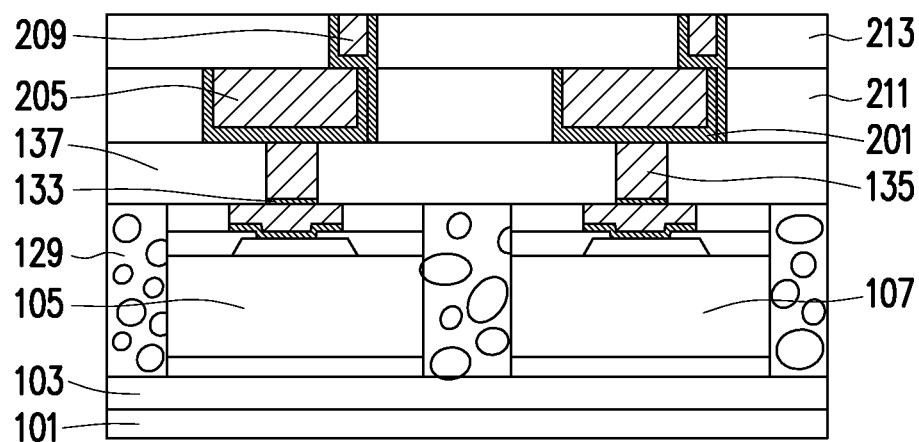

FIG. 7G illustrates the embodiment in which the first metallization layer 205 and the second vias 209 are formed using a damascene process to be partially landed. In this embodiment, instead of the second seed layer 201 being formed first, the second dielectric material 211 is initially deposited directly onto the first dielectric material 137 and the first vias 135. For example, the second dielectric material 211 may be formed as a polyimide derivative, and using e.g., a spin-coating process. However, any suitable material and method of deposition may be utilized.

Once the second dielectric material 211 is placed, the second dielectric material 211 may be patterned in order to form the desired shape for the first metallization layer 205. In an embodiment the second dielectric material 211 may be patterned by initially applying and then exposing and developing a photoresist in order to form a pattern in the shape desired for first metallization layer 205.

Once the pattern is defined into the photoresist, the pattern of the photoresist may be transferred to the underlying second dielectric material 211. In an embodiment the pattern may be transferred utilizing, e.g., an anisotropic etching process such as a reactive ion etch which removes exposed material of the second dielectric material 211 and exposes the underlying first vias 135. However, any suitable process may be used to transfer the pattern.

After the first vias 135 have been exposed, the openings through the second dielectric material 211 are then filled with a conductive material. In an embodiment a seed layer may be deposited along with one or more barrier layers. In an embodiment the seed layer may be similar to the first seed layer 133, such as by being a titanium layer and a copper layer over the titanium layer that have been deposited using, e.g., physical vapor deposition to line the bottom and sidewall surfaces of the openings. However, any suitable materials and deposition process may be utilized.

Once the seed layer is formed, conductive material may be deposited to fill and overfill the openings. In an embodiment the conductive material may be copper that is deposited using a electroplating or electroless plating process that utilizes the seed layer, and the process may be continued until the conductive material fills and/or overfills the openings within the second dielectric material 211. However, any suitable material and process may be utilized in order to fill the openings with the conductive material.

After the openings have been filled, any excess portions of the conductive material that are located outside of the openings through the second dielectric material 211 are removed to form the first metallization layer 205. In an embodiment the excess portions may be removed using, e.g., a planarizing process such as a chemical mechanical polishing process, a grinding process, other chemical processes, combinations of these, or the like. However, any suitable process of embedding the conductive material into the second dielectric material 211 and forming the first metallization layer 205 may be utilized.

FIG. 7G additionally illustrates that, once the first metallization layer 205 is formed, the second vias 209 may also be formed utilizing a damascene process. For example, once the first metallization layer 205 is formed, the second via dielectric layer 213 may be deposited over the first metallization layer 205. In an embodiment the second via dielectric layer 213 may be a similar material and deposited using a similar process as the second dielectric material 211, such as by being formed as a polyimide derivative, and using, e.g., a spin-coating process. However, any suitable material and method of deposition may be utilized.

Once the second via dielectric layer 213 is placed, the second via dielectric layer 213 may be patterned in order to form the desired shape for the second vias 209. In an embodiment the second via dielectric layer 213 may be patterned by initially applying and then exposing and developing a photoresist in order to form a pattern in the shape desired for second vias 209.

Once the pattern is defined into the photoresist, the pattern of the photoresist may be transferred to the underlying second via dielectric layer 213. In an embodiment the pattern may be transferred utilizing, e.g., an anisotropic etching process such as a reactive ion etch which removes exposed material of the second via dielectric layer 213 and exposes the underlying first metallization layer 205. However, any suitable process may be used to transfer the pattern.

Additionally in this embodiment, the anisotropic etching process is not stopped when the top surface of the underlying first metallization layer 205 is exposed. Rather, the etching process is continued so that a portion of the second dielectric material 211 is removed to expose a sidewall of the first metallization layer 205 and, in some embodiments, expose the first dielectric material 137.

After the first metallization layer 205 is exposed, the openings through the second via dielectric layer 213 and the second dielectric material 211 are then filled with a conductive material. In an embodiment a seed layer may be deposited along with one or more barrier layers. In an embodiment the seed layer may be similar to the first seed layer 133, such as by being a titanium layer and a copper layer over the titanium layer that have been deposited using, e.g., physical vapor deposition to line the bottom and sidewall surfaces of the openings. However, any suitable materials and deposition process may be utilized.

Once the seed layer is formed, conductive material may be deposited to fill and overfill the openings. In an embodiment the conductive material may be copper that is deposited using a electroplating or electroless plating process that utilizes the seed layer, and the process may be continued until the conductive material fills and/or overfills the openings within the second via dielectric layer 213 and the second dielectric material 211. However, any suitable material and process may be utilized in order to fill the openings with the conductive material.

After the openings have been filled, any excess portions of the conductive material that are located outside of the openings through the second via dielectric layer 213 and the second dielectric material 211 are removed to form the second vias 209. In an embodiment the excess portions may be removed using, e.g., a planarizing process such as a chemical mechanical polishing process, a grinding process, other chemical processes, combinations of these, or the like. However, any suitable process of embedding the conductive material into the second via dielectric layer 213 and the second dielectric material 211 and forming the second vias 209 may be utilized.

Figure 8:
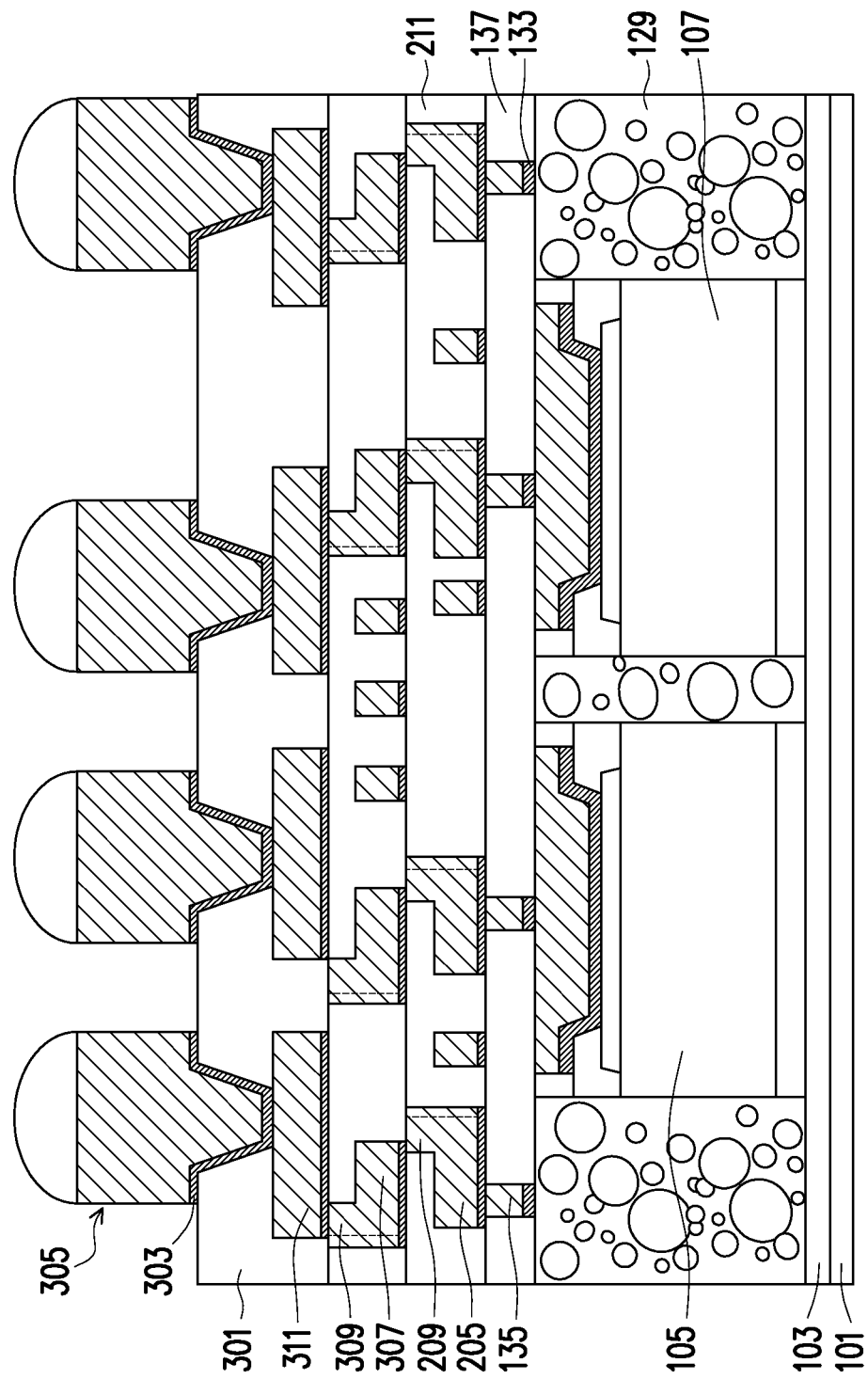

FIG. 8 illustrates that, once the first metallization layer 205 and the second vias 209 have been formed in this embodiment, similar processes may be repeated in order to form the second metallization layer 307 and the third via 309 (both formed using a single seed layer) and the third metallization layer 311, all with the vias being partially landed on the underlying metallization layer. Further, once the third metallization layer 311 is formed the passivation layer 301 may be formed and patterned, the underbump metallizations 303 may be formed, and the third external connectors 305 may be placed as described above with respect to FIG. 3. However, any suitable methods and materials may be utilized.

Figure 9:
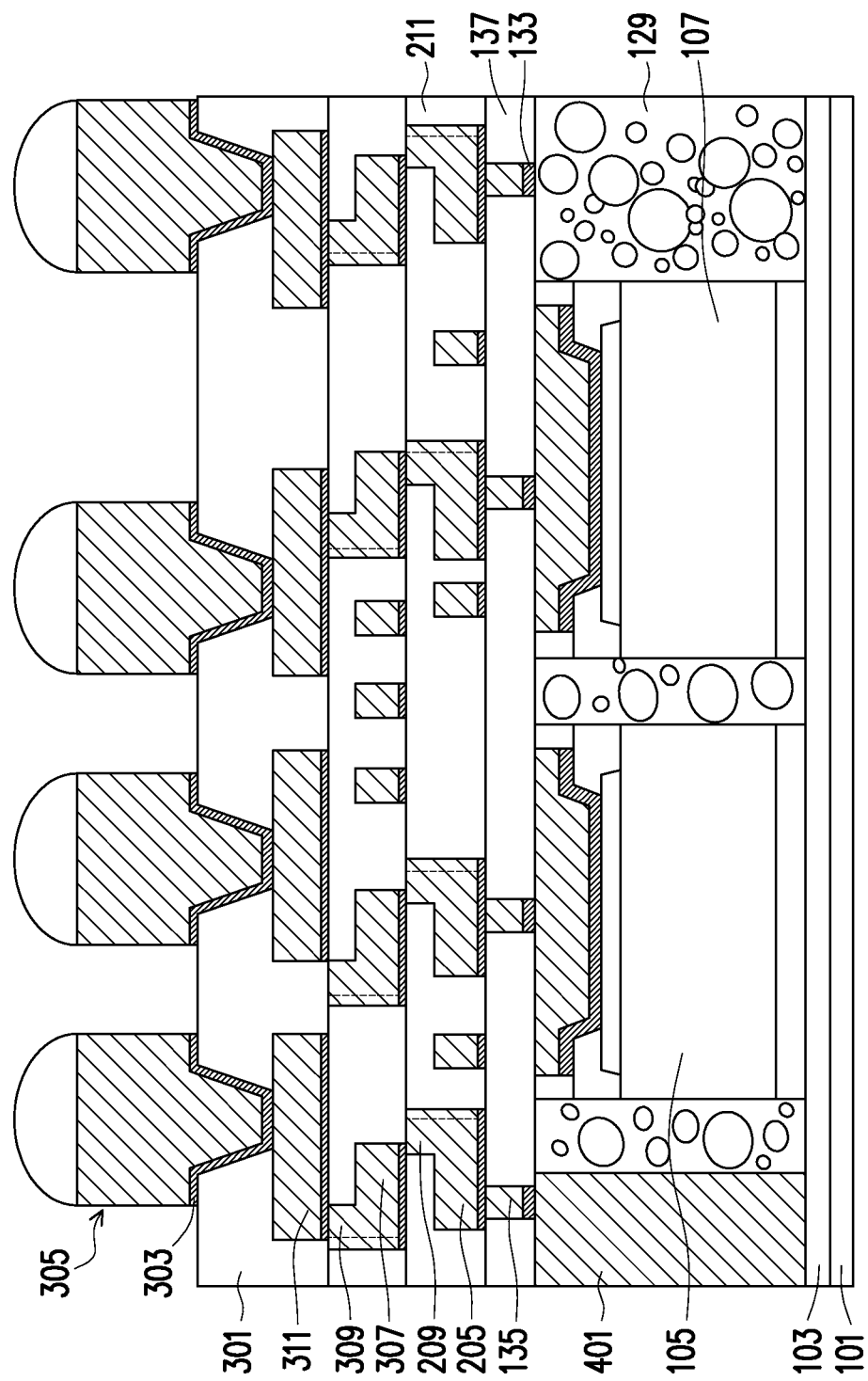

FIG. 9 illustrates another embodiment in which the second vias 209 (or any suitable via) is formed as being partially landed on the first metallization layer 205. In this embodiment, however, the TIVs 401 are additionally formed in order to electrically connect the first vias 135 to an opposite side of the encapsulant 129. In an embodiment the TIVs 401 may be formed as described above with respect to FIG. 4. For example, the TIVs may be formed using an electroplating process before the first semiconductor device 105 and the second semiconductor device 107 are placed on the polymer layer 103. However, any suitable method of forming the TIVs 401 are fully intended to be included within the scope of the embodiments.

Figure 10:
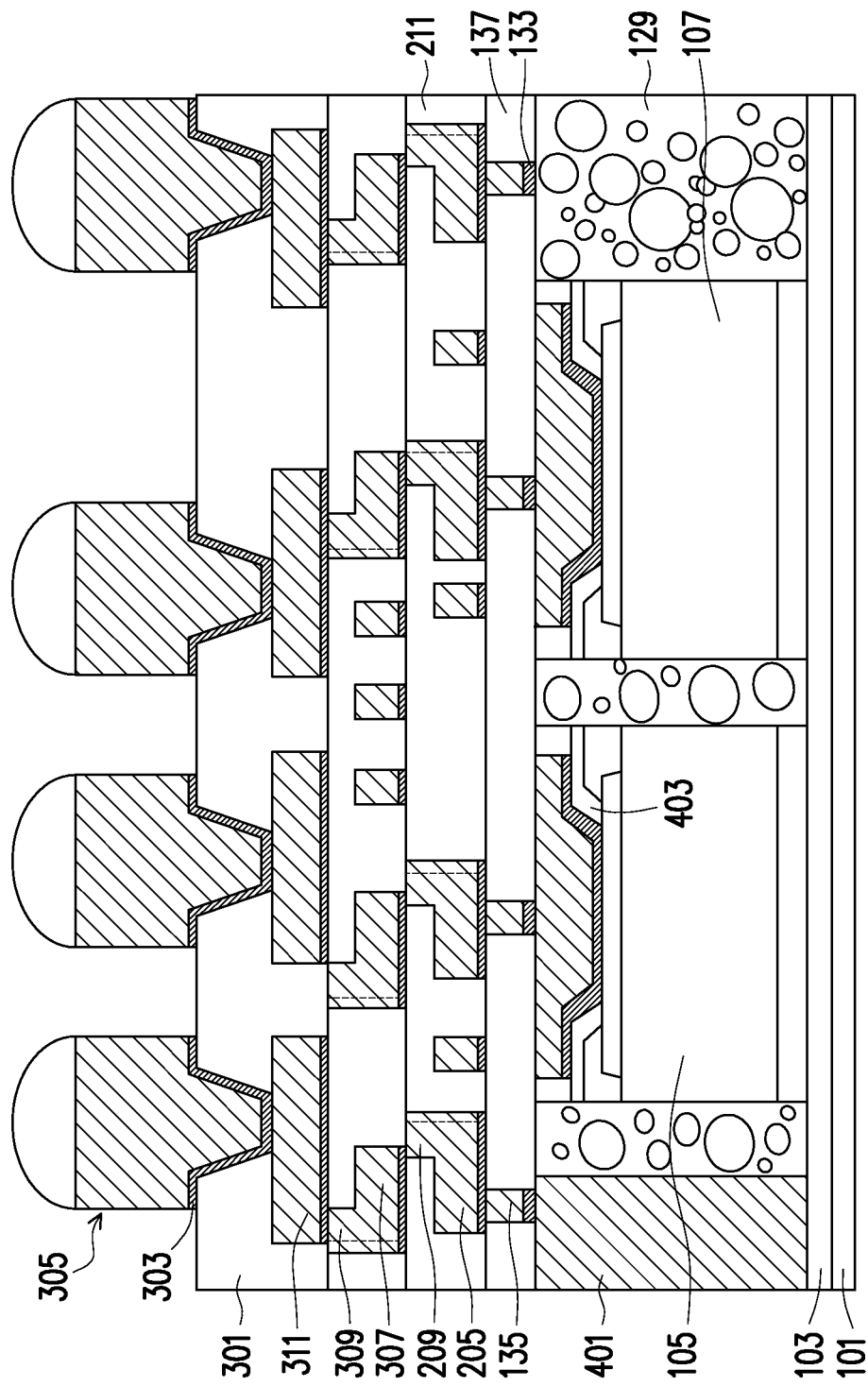

FIG. 10 illustrates an embodiment in which, in addition to the TIVs 401 as described in FIG. 9, the third passivation layer 403 is also formed between the first passivation layer 113 and the first external connectors 115. In this embodiment the third passivation layer 403 may be formed as described above with respect to FIG. 4. However, any suitable method and materials may be utilized.

Figure 11:
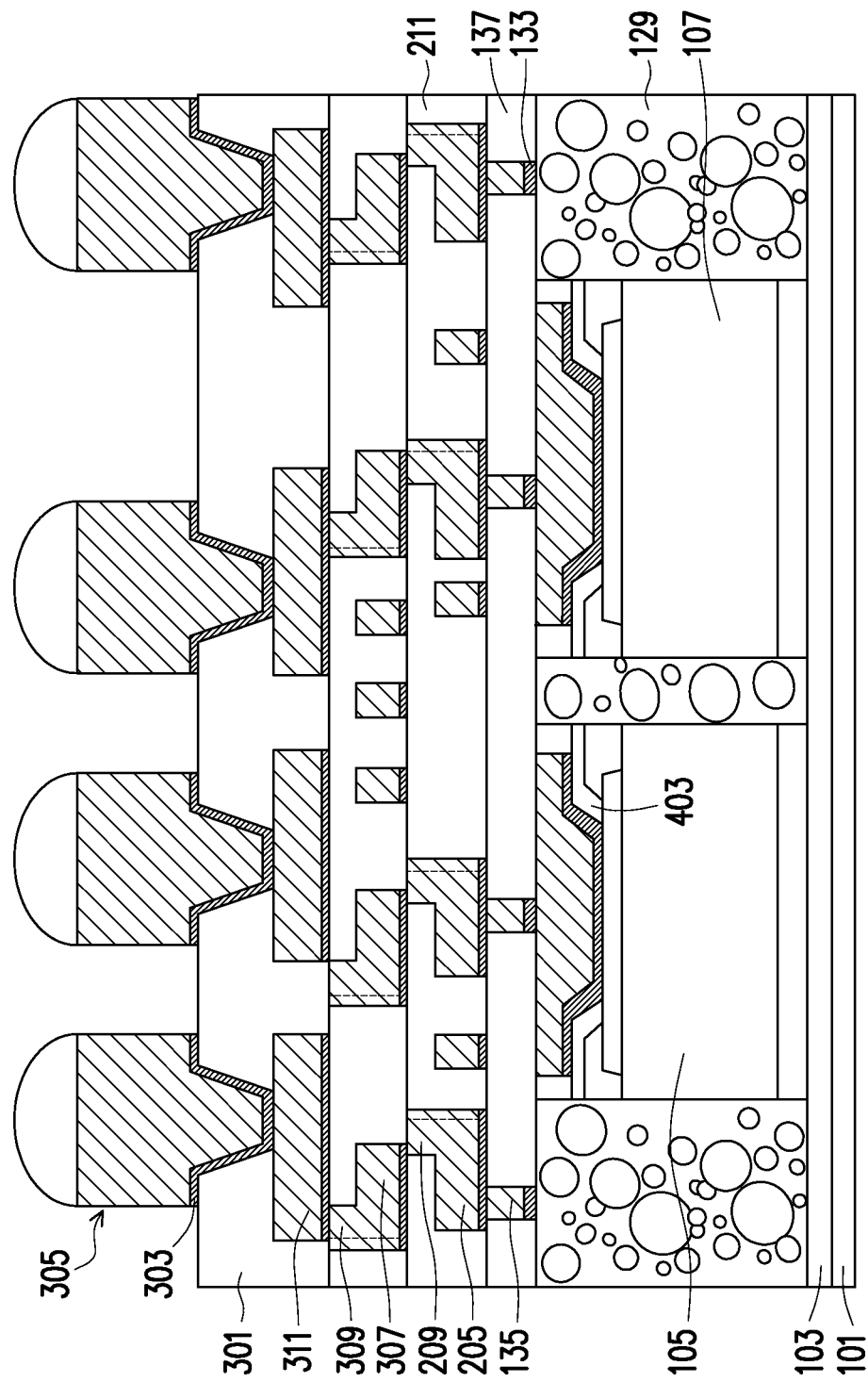

FIG. 11 illustrates an embodiment in which the third passivation layer 403 is utilized without the presence of the TIVs 401. In this embodiment some of the first vias 135, instead of being electrically connected to the TIVs 401, are instead utilized as dummy materials to provide structural support.

Figure 12A:
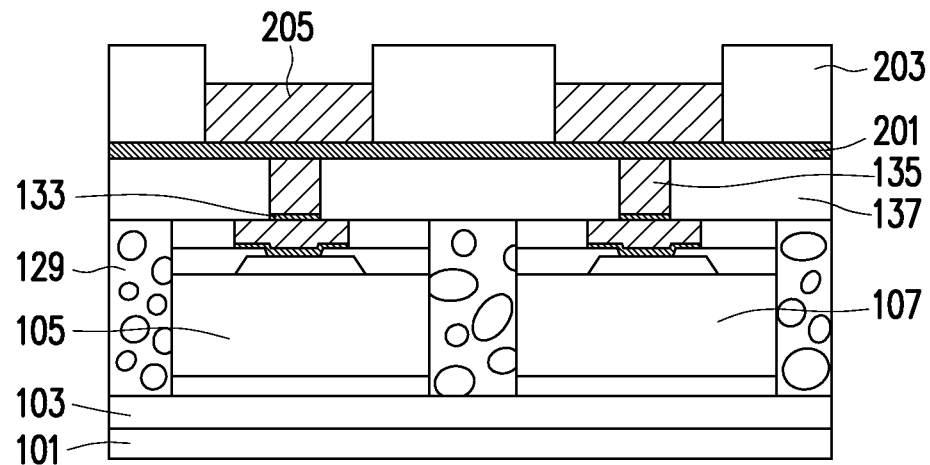
FIGS. 12A-16 illustrate partially landed vias not in physical contact with a seed layer, in accordance with some embodiments.
Figure 12B:
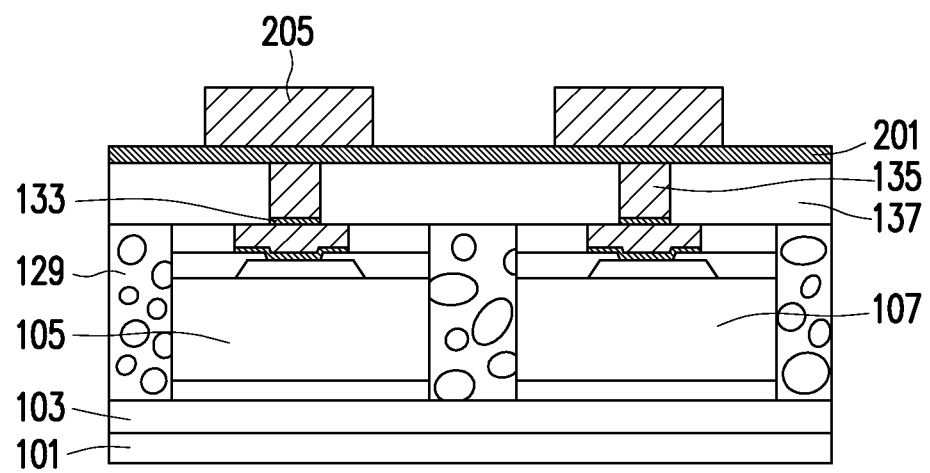

FIGS. 12A-12F illustrate another embodiment in which the second vias 209, instead of being formed fully landed on the first metallization layer 205, are formed being partially landed on the first metallization layer 205. In this embodiment, FIGS. 12A and 12B are similar to FIGS. 2A-2B as described above. As such, this description is not repeated.

Figure 12C:
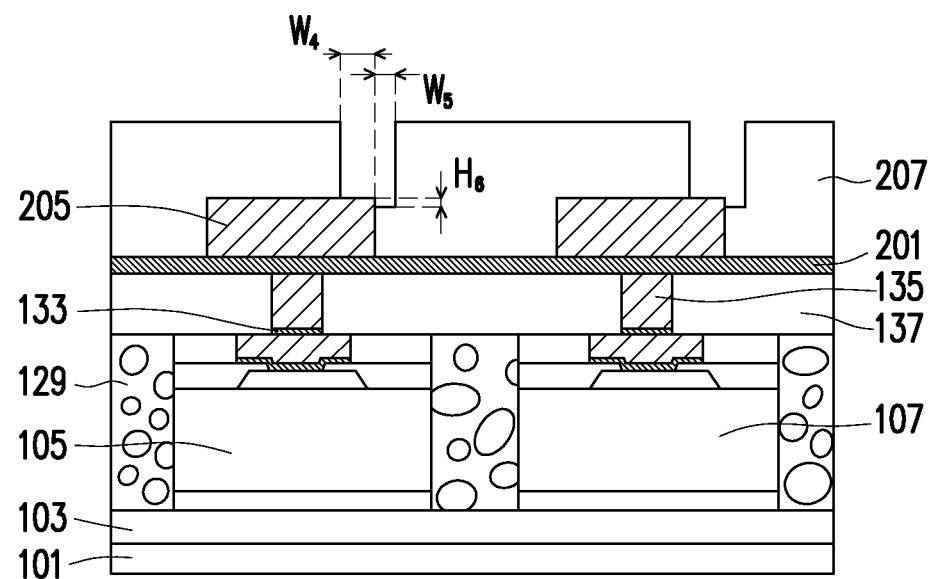

FIG. 12C illustrates a deposition and patterning of the third photoresist 207 over the first metallization layer 205. In an embodiment the third photoresist 207 may be deposited or placed and patterned as described above with respect to FIG. 2C, such as by being exposed and developed to form a pattern with straight and vertical or almost vertical sidewalls. However, in this embodiment, instead of being patterned to expose a top surface of the first metallization layer 205, the third photoresist 207 is patterned in order to expose both a portion of the top surface of the first metallization layer 205 and also expose a portion (but not all) of a sidewall of the first metallization layer 205. Such an exposure of the sidewalls of the first metallization layer 205 may be performed using a timed development process or, in another embodiment, may be performed using a controlled exposure that exposes a portion, but not all, of the depth of the third photoresist 207. Additionally in this embodiment, the second seed layer 201 remains fully covered by either the first metallization layer 205 or the third photoresist 207.

Figure 12D:
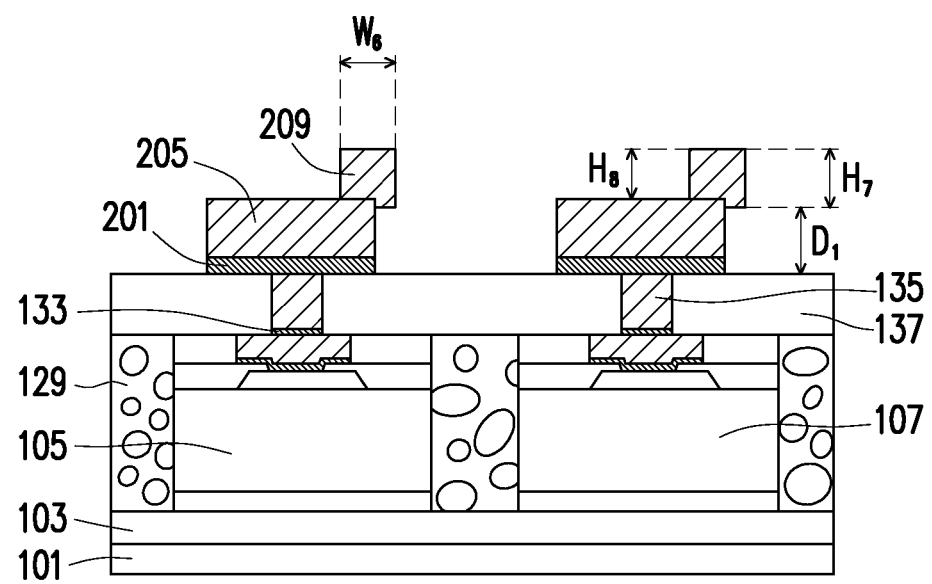

FIG. 12D illustrates a formation of the second vias 209 within the third photoresist 207. In an embodiment the formation of the second vias 209 may be performed as described above with respect to FIG. 2C. For example, the second vias 209 may be formed using an electroplating process which at least partially fills the openings in the third photoresist 207, wherein the first metallization layer 205 and the second vias 209 are formed using the same seed layer, wherein the second vias 209 take on the shape of the pattern, including having straight and vertical or almost vertical sidewalls. In this embodiment, however, the material for the second vias 209 not only covers the top surface of the first metallization layer 205, but also covers a portion (but not all) of the side surface of the first metallization layer 205.

For example, in this embodiment, the third photoresist 207 may be patterned such that the surface of the first metallization layer 205 that is exposed has the fourth width $W_4$ of between about 0.1 µm and about 20 µm, such as about 5 µm, and a portion of the third photoresist 207 removed adjacent to the first metallization layer 205 has the fifth width $W_5$ of between about 0.1 µm and about 20 µm, such as about 5 µm. Additionally, a portion of the sidewall of the first metallization layer 205 may have a sixth height $H_6$ of between about 0.01 µm and about 10 µm, such as about 1 µm. However, any suitable dimensions may be utilized.

FIG. 12D additionally illustrates a removal of the third photoresist 207. In an embodiment the third photoresist 207 may be removed as described above with respect to FIG. 2D. For example, an ashing process may be utilized to remove the third photoresist 207. However, any suitable process may be utilized to remove the third photoresist 207.

In this embodiment the second vias 209 may have the sixth width $W_6$ of between about 0.1 µm and about 20 µm, such as about 5 µm. Similarly, the second vias 209 in this embodiment may have an seventh height $H_7$ (over the second seed layer 201 and along the sidewall of the first metallization layer 205) of between about 0.01 µm and about 20 µm, such as about 5 µm, while the second vias 209 may have a eighth height $H_8$ (over the first metallization layer 205) of between about 0.01 µm and about 20 µm, such as about 3 µm. However, any suitable dimensions may be utilized.

Finally, FIG. 12D also illustrates an etching of the second seed layer 201. In an embodiment the second seed layer 201 may be etched as described above with respect to FIG. 2D. For example, a wet or dry etching process may be utilized to remove the exposed portions of the second seed layer 201. Because of the removal of the second seed layer 201 from beneath a portion of the second vias 209, the second vias 209 may be separated from the first dielectric material 137 by a first distance $D_1$ of between about 0.01 µm and about 20 µm, such as about 5 µm. However, any suitable process and dimensions may be utilized.

Figure 12E:
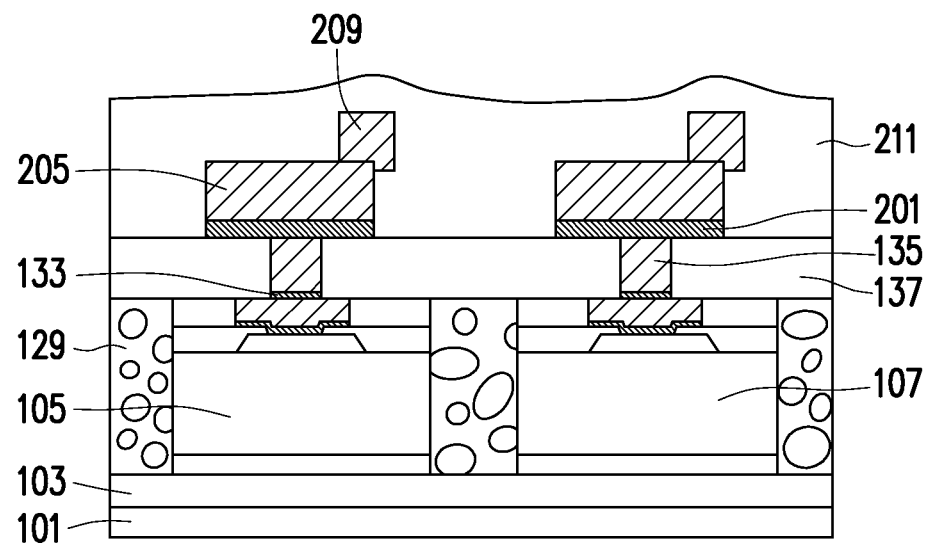
Figure 12F:
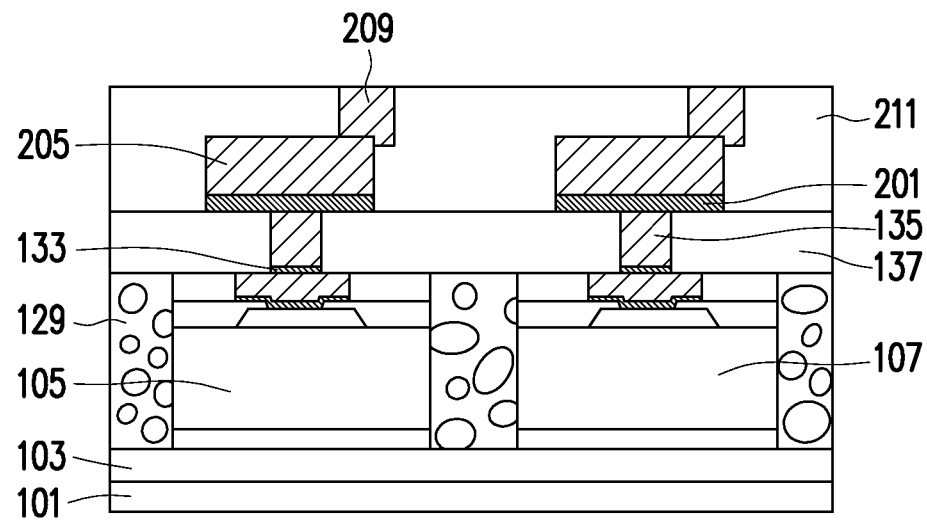

FIGS. 12E and 12F illustrate the placement and planarization of the second dielectric material 211 over the second vias 209. In an embodiment the second dielectric material 211 may be placed and planarized as described above with respect to FIGS. 2E and 2F. For example, the second dielectric material 211 may be deposited and cured, and then a CMP, mechanical grinding, or chemical approach process may be utilized to planarize the second dielectric material 211 and expose the second vias 209. However, any suitable process may be utilized.

Figure 12G:
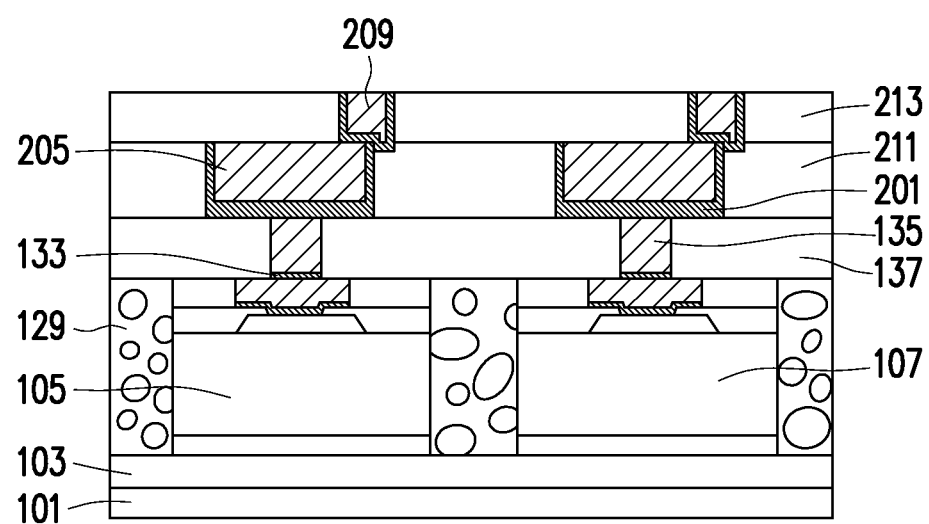

FIG. 12G illustrates the embodiment in which the first metallization layer 205 and the second vias 209 are formed using a damascene process to be partially landed. In this embodiment, instead of the second seed layer 201 being formed first, the second dielectric material 211 is initially deposited directly onto the first dielectric material 137 and the first vias 135. For example, the second dielectric material 211 may be formed as a polyimide derivative, and using, e.g., a spin-coating process. However, any suitable material and method of deposition may be utilized.

Once the second dielectric material 211 is placed, the second dielectric material 211 may be patterned in order to form the desired shape for the first metallization layer 205. In an embodiment the second dielectric material 211 may be patterned by initially applying and then exposing and developing a photoresist in order to form a pattern in the shape desired for first metallization layer 205.

Once the pattern is defined into the photoresist, the pattern of the photoresist may be transferred to the underlying second dielectric material 211. In an embodiment the pattern may be transferred utilizing, e.g., an anisotropic etching process such as a reactive ion etch which removes exposed material of the second dielectric material 211 and exposes the underlying first vias 135. However, any suitable process may be used to transfer the pattern.

After the first vias 135 have been exposed, the openings through the second dielectric material 211 are then filled with a conductive material. In an embodiment a seed layer may be deposited along with one or more barrier layers. In an embodiment the seed layer may be similar to the first seed layer 133, such as by being a titanium layer and a copper layer over the titanium layer that have been deposited using, e.g., physical vapor deposition to line the bottom and sidewall surfaces of the openings. However, any suitable materials and deposition process may be utilized.

Once the seed layer is formed, conductive material may be deposited to fill and overfill the openings. In an embodiment the conductive material may be copper that is deposited using a electroplating or electroless plating process that utilizes the seed layer, and the process may be continued until the conductive material fills and/or overfills the openings within the second dielectric material 211. However, any suitable material and process may be utilized in order to fill the openings with the conductive material.

After the openings have been filled, any excess portions of the conductive material that are located outside of the openings through the second dielectric material 211 are removed to form the first metallization layer 205. In an embodiment the excess portions may be removed using, e.g., a planarizing process such as a chemical mechanical polishing process, a grinding process, other chemical processes, combinations of these, or the like. However, any suitable process of embedding the conductive material into the second dielectric material 211 and forming the first metallization layer 205 may be utilized.

FIG. 12G additionally illustrates that, once the first metallization layer 205 is formed, the second vias 209 may also be formed utilizing a damascene process. For example, once the first metallization layer 205 is formed, the second via dielectric layer 213 may be deposited over the first metallization layer 205. In an embodiment the second via dielectric layer 213 may be a similar material and deposited using a similar process as the second dielectric material 211, such as by being formed as a polyimide derivative, and using e.g., a spin-coating process. However, any suitable material and method of deposition may be utilized.

Once the second via dielectric layer 213 is placed, the second via dielectric layer 213 may be patterned in order to form the desired shape for the second vias 209. In an embodiment the second via dielectric layer 213 may be patterned by initially applying and then exposing and developing a photoresist in order to form a pattern in the shape desired for second vias 209.

Once the pattern is defined into the photoresist, the pattern of the photoresist may be transferred to the underlying second via dielectric layer 213. In an embodiment the pattern may be transferred utilizing, e.g., an anisotropic etching process such as a reactive ion etch which removes exposed material of the second via dielectric layer 213 and exposes the underlying first metallization layer 205. However, any suitable process may be used to transfer the pattern.

Additionally in this embodiment, the anisotropic etching process is not stopped when the top surface of the underlying first metallization layer 205 is exposed. Rather, the etching process is continued so that a portion, but not all, of the second dielectric material 211 is removed to expose part of a sidewall of the first metallization layer 205.

After the first metallization layer 205 is exposed, the openings through the second via dielectric layer 213 and into the second dielectric material 211 are then filled with a conductive material. In an embodiment a seed layer may be deposited along with one or more barrier layers. In an embodiment the seed layer may be similar to the first seed layer 133, such as by being a titanium layer and a copper layer over the titanium layer that have been deposited using, e.g., physical vapor deposition to line the bottom and sidewall surfaces of the openings. However, any suitable materials and deposition process may be utilized.

Once the seed layer is formed, conductive material may be deposited to fill and overfill the openings. In an embodiment the conductive material may be copper that is deposited using a electroplating or electroless plating process that utilizes the seed layer, and the process may be continued until the conductive material fills and/or overfills the openings within the second via dielectric layer 213 and the second dielectric material 211. However, any suitable material and process may be utilized in order to fill the openings with the conductive material.

After the openings have been filled, any excess portions of the conductive material that are located outside of the openings through the second via dielectric layer 213 and the second dielectric material 211 are removed to form the second vias 209. In an embodiment the excess portions may be removed using, e.g., a planarizing process such as a chemical mechanical polishing process, a grinding process, other chemical processes, combinations of these, or the like. However, any suitable process of embedding the conductive material into the second via dielectric layer 213 and the second dielectric material 211 and forming the second vias 209 may be utilized.

Figure 13:
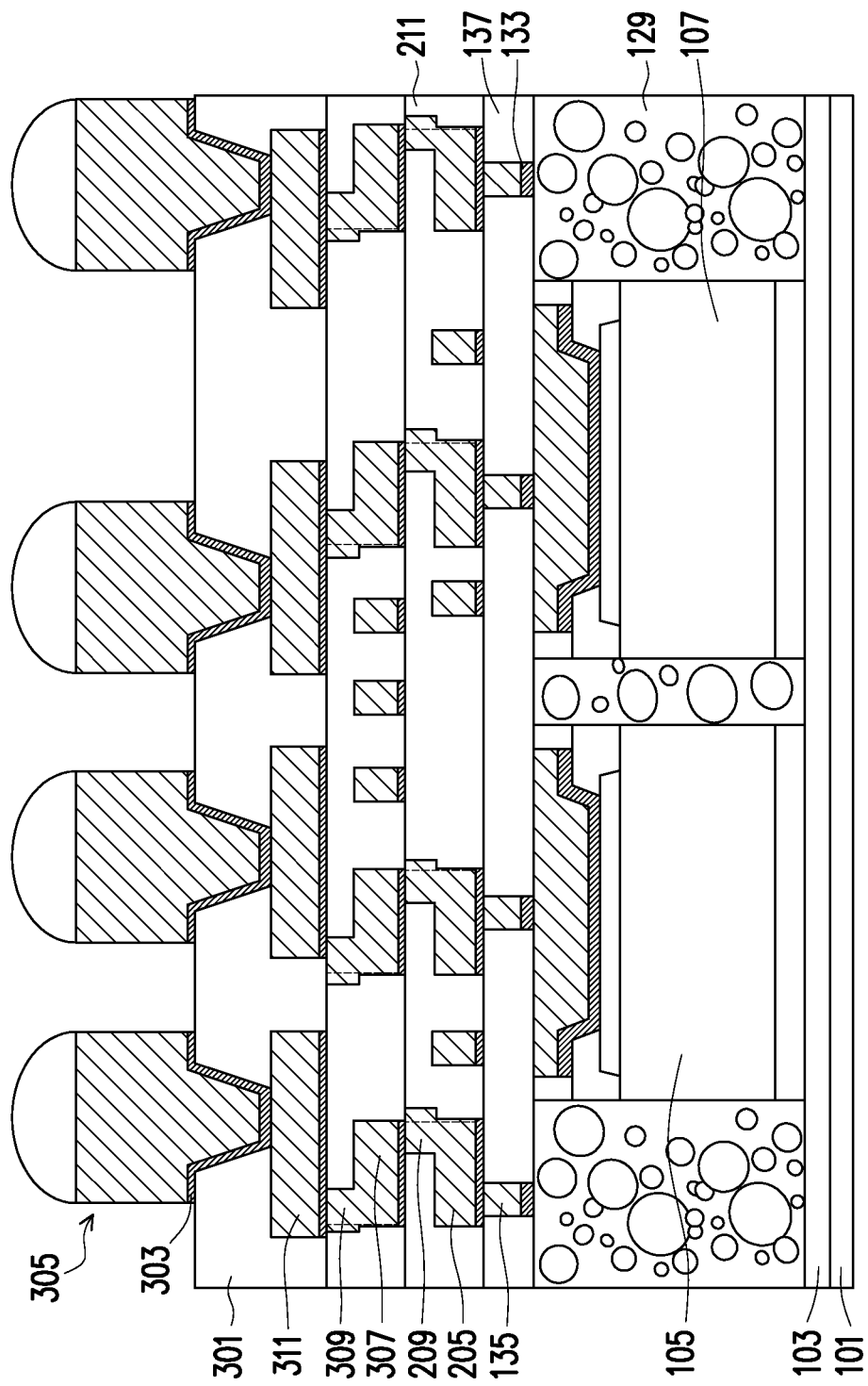

FIG. 13 illustrates that, once the first metallization layer 205 and the second vias 209 have been formed in this embodiment, similar processes may be repeated in order to form the second metallization layer 307 and the third via 309 (both formed using a single seed layer) and the third metallization layer 311, all with the vias being partially landed on the underlying metallization layer. Further, once the third metallization layer 311 is formed the passivation layer 301 may be formed and patterned, the underbump metallizations 303 may be formed, and the third external connectors 305 may be placed as described above with respect to FIG. 3. However, any suitable methods and materials may be utilized.

Figure 14:
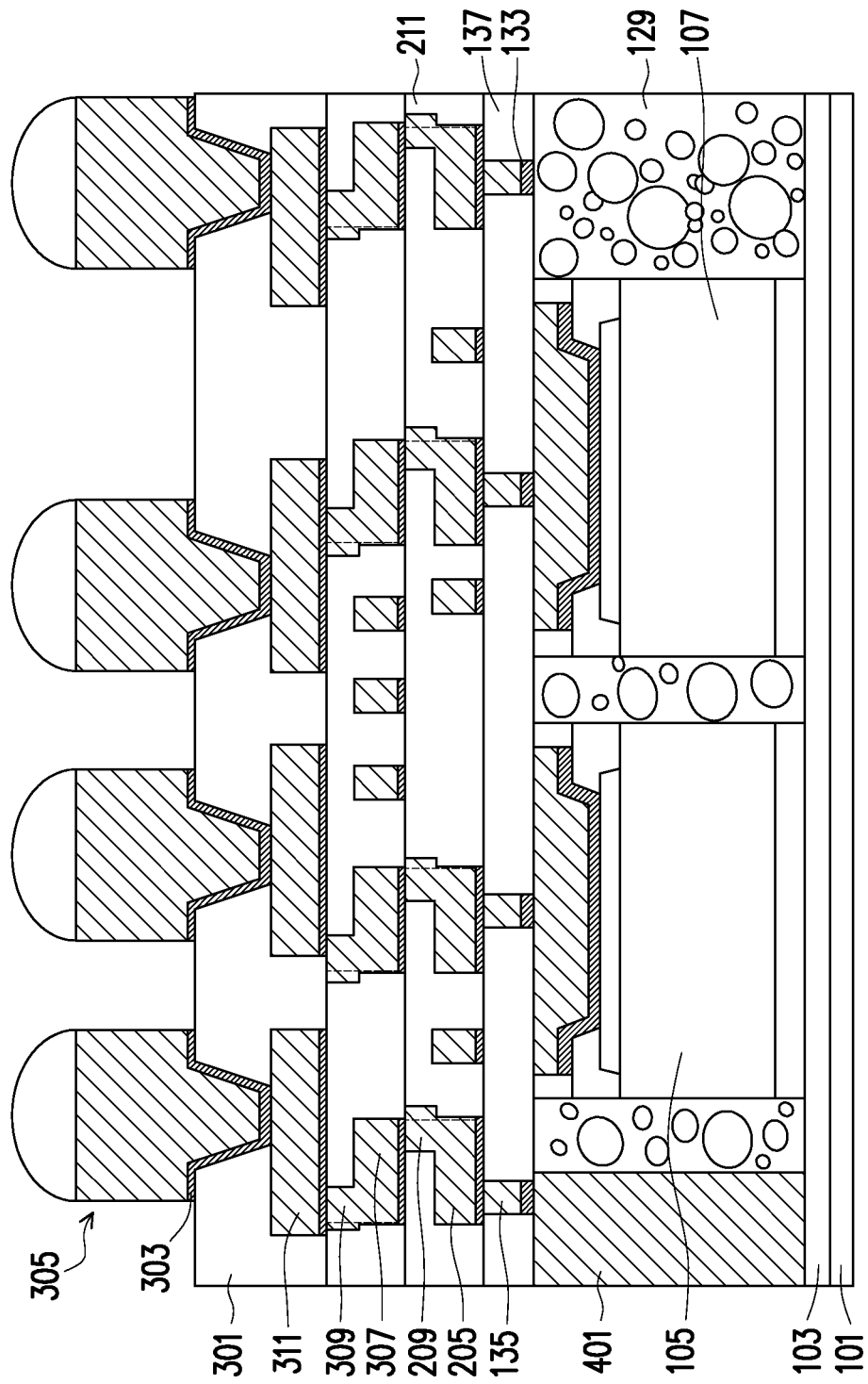

FIG. 14 illustrates another embodiment in which the second vias 209 (or any suitable via) are formed as being partially landed on the first metallization layer 205. In this embodiment, however, the TIVs 401 are additionally formed in order to electrically connect the first vias 135 to an opposite side of the encapsulant 129. In an embodiment the TIVs 401 may be formed as described above with respect to FIG. 4. For example, the TIVs may be formed using an electroplating process before the first semiconductor device 105 and the second semiconductor device 107 are placed on the polymer layer 103. However, any suitable method of forming the TIVs 401 are fully intended to be included within the scope of the embodiments.

Figure 15:
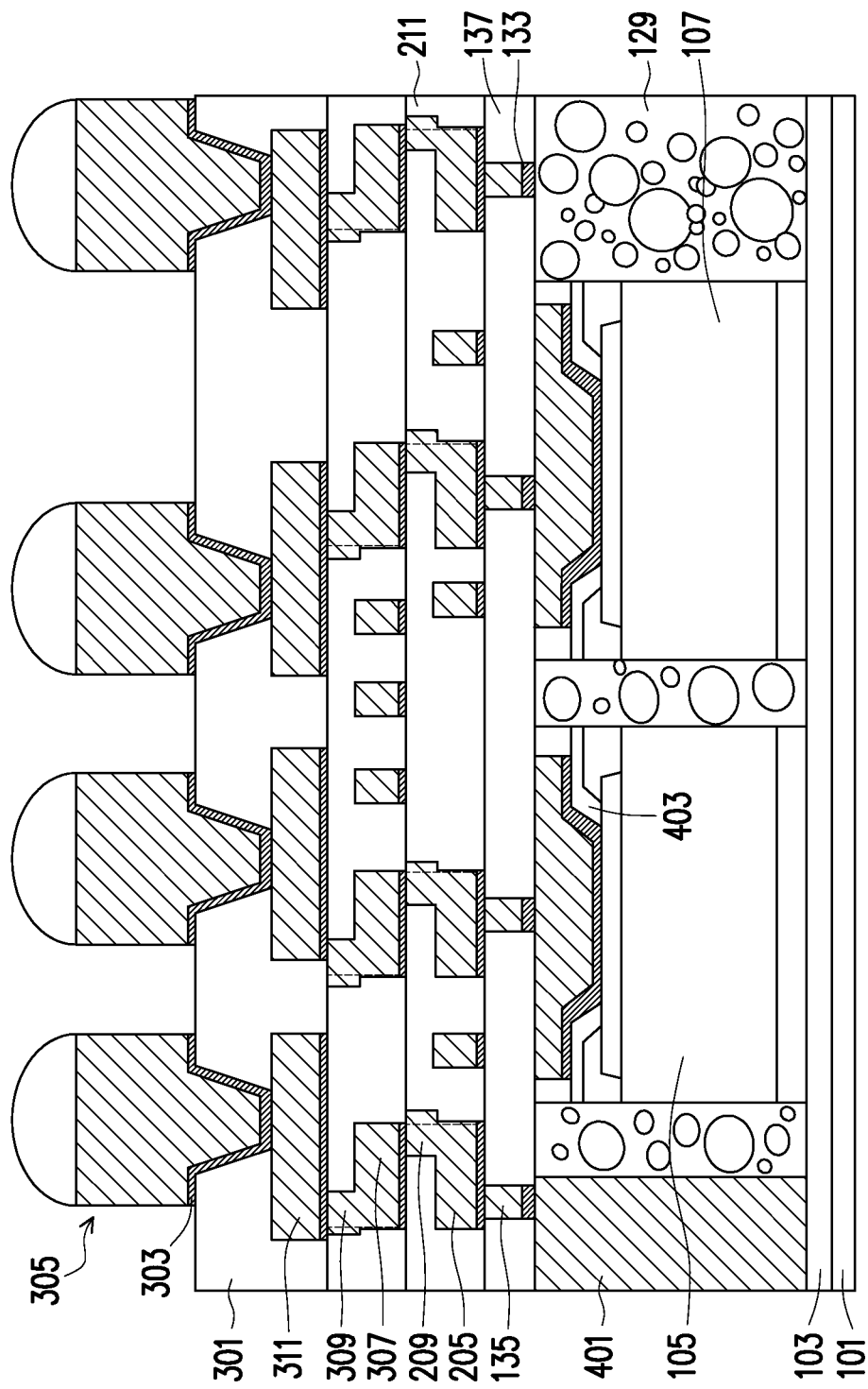

FIG. 15 illustrates an embodiment in which, in addition to the TIVs 401 as described in FIG. 14, the third passivation layer 403 is also formed between the first passivation layer 113 and the first external connectors 115. In this embodiment the third passivation layer 403 may be formed as described above with respect to FIG. 4. However, any suitable method and materials may be utilized.

Figure 16:
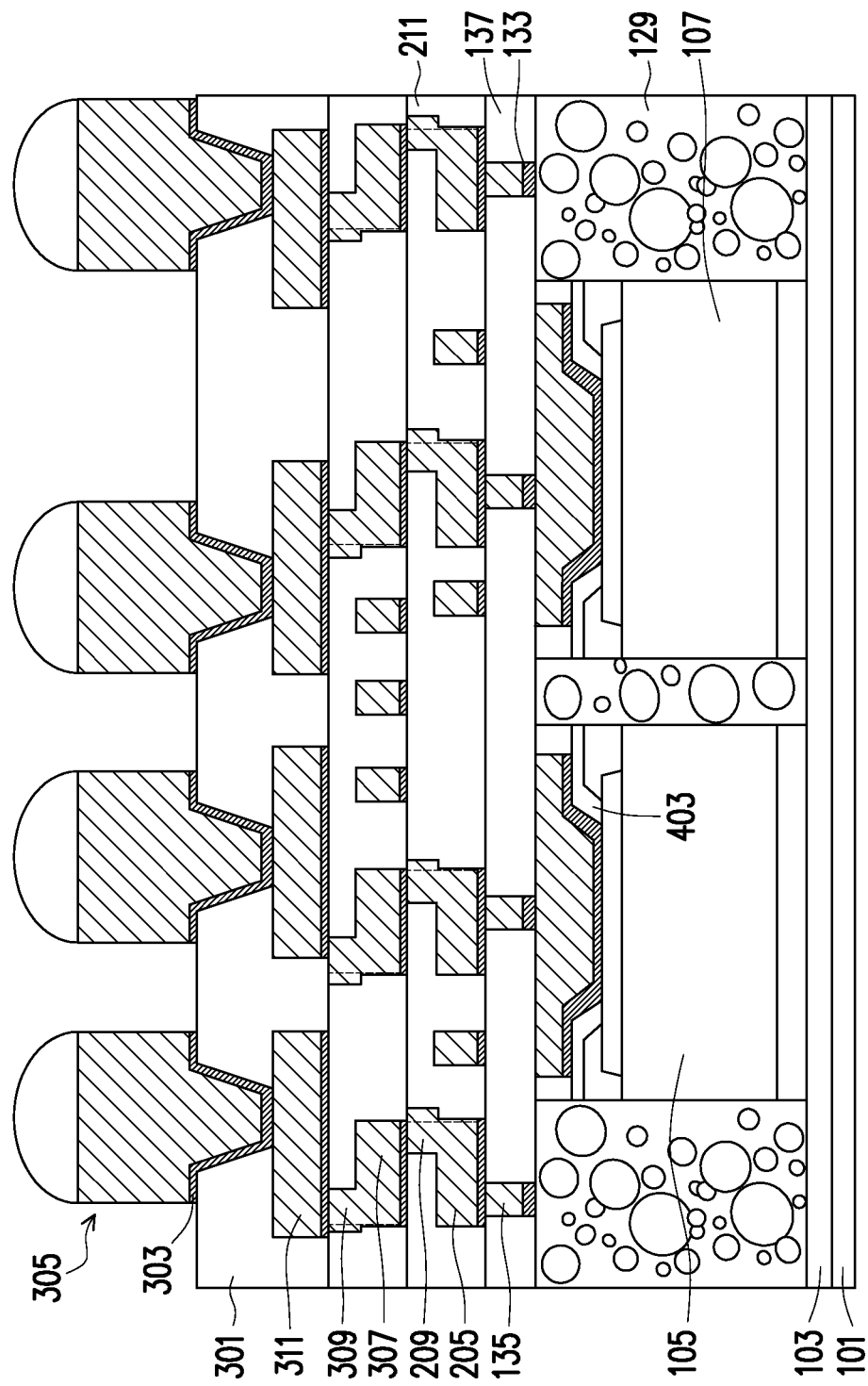

FIG. 16 illustrates an embodiment in which the third passivation layer 403 is utilized without the presence of the TIVs 401. In this embodiment some of the first vias 135, instead of being electrically connected to the TIVs 401, are instead utilized as dummy materials to provide structural support.

By forming the metallization layers and vias as described herein, a low cost, high resolution metallization layer may be formed in order to redistribute the signals from the first semiconductor device 105 and the second semiconductor device 107. In particular, by utilizing the high resolution of photoresist and the same barrier/PVD seed layer during the formation of both the metallization layer and an associated via (thereby skipping the separate seed layer sputtering), a highly planarized surface with a fine pitch may be obtained, there is no PM layer resolution window issue, and a vertical profile may be obtained for the vias, thereby reducing the process windows and allowing more vias to be integrated into a smaller area. Additionally, further cost savings can be obtained by avoiding a seed layer etch for the formation of the vias (as the same seed layer is used for both the via and the metallization layer).

Once the processes described herein are completed, further processing may be performed. For example, the first carrier substrate 101 may be removed and, if the TIVs 401 are present, electrical connections such as external connections or external connections along with one or more redistribution layers, may be formed. Once the external connections are formed, the entire package may be connected to another substrate, such as a printed circuit board or interposer in preparation for usage.

In an embodiment a method of manufacturing a semiconductor device includes forming a first via to a first semiconductor device encapsulated in an encapsulant; forming a seed layer over the first via; forming a metallization layer over the seed layer, the metallization layer having a first width; and forming a second via over the metallization layer, the second via having a second width less than the first width, wherein the forming the metallization layer and the forming the second via both utilize the seed layer. In an embodiment, the method further includes forming a third via; placing the first semiconductor device next to the third via; and encapsulating the third via and the first semiconductor device to form the first semiconductor device encapsulated in the encapsulant. In an embodiment, the forming the second via forms a fully landed via. In an embodiment, the forming the second via forms a partially landed via. In an embodiment, the forming the second via forms the second via to cover a sidewall of the metallization layer. In an embodiment, the forming the second via forms the second via to partially cover a sidewall of the metallization layer.

In another embodiment a method of manufacturing a semiconductor device includes depositing a seed layer over a first via, the first via being electrically connected to a first external connection of a first die, the first die being encapsulated within an encapsulant; patterning a first opening into a first photoresist over the seed layer; electroplating a first metallization layer within the first opening of the first photoresist utilizing the seed layer; removing the first photoresist; after the removing the first photoresist, patterning a second opening into a second photoresist over the first metallization layer; and electroplating a second via within the second opening of the second photoresist utilizing the seed layer. In an embodiment, the second opening exposes a top surface of the first metallization layer. In an embodiment, the second opening exposes a sidewall of the first metallization layer. In an embodiment, the second opening exposes a portion of the seed layer. In an embodiment, the method further includes removing the second photoresist; depositing a dielectric material over the first metallization layer; and planarizing the dielectric material with the second via. In an embodiment, the method further includes prior to the depositing the seed layer, forming a third via over a substrate; attaching the first die to the substrate after the forming the third via over the substrate; and encapsulating the first die and the third via with the encapsulant after the attaching the first die to the substrate. In an embodiment, the method further includes forming the first via after the encapsulating the first die. In an embodiment, the first die comprises a first dielectric material and a second dielectric material different from the first dielectric material, wherein both the first dielectric material and the second dielectric material are located between a contact pad and the first external connection.

In yet another embodiment a semiconductor device includes a semiconductor die encapsulated within an encapsulant; a first via extending through a first dielectric layer to make contact with the semiconductor die, the first via having almost straight sidewalls from a top of the first via to a bottom of the first via; a first seed layer in electrical connection with the first via; a first metallization layer over and in physical contact with the first seed layer, the first metallization layer comprising a first material throughout the first metallization layer; a second via in direct physical contact with the first metallization layer, the second via comprising a second material throughout the second via; and a dielectric material covering sidewalls of both the first metallization layer and the second via, the dielectric material comprising a third material throughout the dielectric material, wherein a first surface of the second via facing away from the first metallization layer is exposed by the dielectric material. In an embodiment, a portion of the dielectric material extends between the second via and the first dielectric layer. In an embodiment, the second via is in physical contact with the first seed layer. In an embodiment, the second via is fully landed on the first metallization layer. In an embodiment, the semiconductor device further includes a third via extending from a first side of the encapsulant to a second side of the encapsulant. In an embodiment, the semiconductor device further includes a third via located in the first dielectric layer, the third via being in physical contact with the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first via to a first semiconductor device encapsulated in an encapsulant;
   forming a seed layer over the first via;
   forming a metallization layer over the seed layer, the metallization layer having a first width; and
   forming a second via over the metallization layer, the second via having a second width less than the first width, wherein the forming the metallization layer and the forming the second via both utilize the seed layer, and wherein the forming the second via forms the second via to cover a sidewall of the metallization layer, the sidewall being at a right angle to a surface of the metallization layer facing away from the first semiconductor device, wherein the seed layer is exposed during the forming the second via.

2. The method of claim 1, further comprising:
   forming a third via;
   placing the first semiconductor device next to the third via; and
   encapsulating the third via and the first semiconductor device to form the first semiconductor device encapsulated in the encapsulant.

3. The method of claim 1, wherein the encapsulant surrounds a through integrated fan out via.

4. The method of claim 1, further comprising:
   depositing a dielectric material over the second via; and
   planarizing the dielectric material to expose the second via.

5. The method of claim 1, wherein the second via extends over the metallization layer a distance of between 0.1 μm and 20 μM.

6. The method of claim 1, wherein the second via has a width adjacent to the metallization layer of between 0.1 μm and 20 μM.

7. The method of claim 1, further comprising etching the seed layer using the metallization layer and the second via as masks.

8. A method of manufacturing a semiconductor device, the method comprising:
- depositing a seed layer over a first via over a substrate, the first via being electrically connected to a first external connection of a first die, the first die being encapsulated within an encapsulant;
- patterning a first opening into a first photoresist over the seed layer;
- electroplating a first metallization layer within the first opening of the first photoresist utilizing the seed layer;
- removing the first photoresist;
- after the removing the first photoresist, patterning a second opening into a second photoresist over the first metallization layer, wherein the second opening exposes a portion of the seed layer; and
- electroplating a second via within the second opening of the second photoresist utilizing the seed layer.

9. The method of claim 8, wherein the second opening exposes a top surface of the first metallization layer.

10. The method of claim 8, further comprising:
removing the second photoresist;
depositing a dielectric material over the first metallization layer; and
planarizing the dielectric material with the second via.

11. The method of claim 8, further comprising:
prior to the depositing the seed layer, forming a third via over the substrate;
attaching the first die to the substrate after the forming the third via over the substrate; and
encapsulating the first die and the third via with the encapsulant after the attaching the first die to the substrate.

12. The method of claim 11, further comprising forming the first via after the encapsulating the first die.

13. The method of claim 8, wherein the first die comprises a first dielectric material and a second dielectric material different from the first dielectric material, wherein both the first dielectric material and the second dielectric material are located between a contact pad and the first external connection.

14. The method of claim 8, wherein the encapsulant surrounds a through integrated fan out via.

15. The method of claim 8, wherein the second via extends over the first metallization layer a distance of between 0.1 μm and 20 μM.

16. A method of manufacturing a semiconductor device, the method comprising:
- encapsulating a semiconductor die within an encapsulant;
- forming a first via extending through a first dielectric layer to electrically couple to the semiconductor die, the first via having straight sidewalls from a top of the first via to a bottom of the first via;
- forming a first seed layer in electrical connection with the first via;
- forming a first metallization layer over and in physical contact with the first seed layer, the first metallization layer comprising a first material throughout the first metallization layer;
- forming a second via in direct physical contact with the first metallization layer, the second via comprising a second material throughout the second via, wherein the second via is in physical contact with the first seed layer; and
- forming a dielectric material covering sidewalls of both the first metallization layer and the second via, the dielectric material comprising a third material throughout the dielectric material, wherein a first surface of the second via facing away from the first metallization layer is exposed by the dielectric material.

17. The method of claim 16, wherein a portion of the dielectric material extends between the second via and the first dielectric layer.

18. The method of claim 16, wherein the second via is fully landed on the first metallization layer.

19. The method of claim 16, further comprising forming a third via, wherein after the forming the third via the third via extends from a first side of the encapsulant to a second side of the encapsulant.

20. The method of claim 16, further comprising forming a third via located in the first dielectric layer, the third via being in physical contact with the encapsulant.

* * * * *

UNITED STATES PATENT AND TRADEMARK OFFICE
CERTIFICATE OF CORRECTION

PATENT NO. : 11,488,908 B2
APPLICATION NO. : 16/587690
DATED : November 1, 2022
INVENTOR(S) : Chen-Hua Yu et al.

It is certified that error appears in the above-identified patent and that said Letters Patent is hereby corrected as shown below:

In the Claims

Claim 5, Column 24, Line 67; delete "µM" and insert --µm--.

Claim 6, Column 25, Line 3; delete "µM" and insert --µm--.

Claim 15, Column 26, Line 8; delete "µM" and insert --µm--.

Signed and Sealed this
Twentieth Day of December, 2022

Katherine Kelly Vidal
*Director of the United States Patent and Trademark Office*